US012787245B2

(12) United States Patent
Aoyagi et al.

(10) Patent No.: US 12,787,245 B2
(45) Date of Patent: Nov. 3, 2026

(54) INTERLEAVED WORD LINES FOR MEMORY DEVICES

(71) Applicant: Taiwan Semiconductor Manufacturing Company, Ltd., Hsinchu (TW)

(72) Inventors: Yumito Aoyagi, Tainan City (TW); Makoto Yabuuchi, Hsinchu County (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 114 days.

(21) Appl. No.: 18/882,093

(22) Filed: Sep. 11, 2024

(65) Prior Publication Data

US 2026/0075790 A1 Mar. 12, 2026

(51) Int. Cl.
*G11C 11/419* (2006.01)
*G11C 11/418* (2006.01)
*H10B 10/00* (2023.01)

(52) U.S. Cl.
CPC ............ *H10B 10/18* (2023.02); *G11C 11/418* (2013.01); *G11C 11/419* (2013.01)

(58) Field of Classification Search
CPC ...... H10B 10/18; G11C 11/418; G11C 11/419
USPC ............................................. 365/154, 230.06
See application file for complete search history.

(56) References Cited

U.S. PATENT DOCUMENTS 6,366,489 B1 * 4/2002 Salling .................... G11C 11/22 257/E21.664
7,738,283 B2 * 6/2010 Wong .................... G11C 11/412 365/230.06
11,508,427 B2 * 11/2022 Wei ..................... G11C 11/2275
2003/0026134 A1 * 2/2003 Lowrey ................ G11C 13/004 365/185.15
2003/0039142 A1 2/2003 Tsao et al.
2005/0180247 A1 * 8/2005 Scheuerlein ............. G11C 8/08 257/E27.103
2007/0002607 A1 * 1/2007 Khellah ................ G11C 11/419 365/154
2008/0130365 A1 6/2008 Combe
2008/0137394 A1 * 6/2008 Shimano .................. G11C 8/16 365/72
2009/0059660 A1 3/2009 Lee et al.
2010/0157656 A1 * 6/2010 Tsuchida ............ G11C 29/4401 365/230.06
2010/0165779 A1 * 7/2010 Zhang ...................... G11C 8/10 365/230.01
2015/0117128 A1 * 4/2015 Caubet .................. G02F 1/1524 438/57

(Continued)

FOREIGN PATENT DOCUMENTS

JP 2000268568 A * 9/2000
KR 20210100404 A * 8/2021 ........... H10W 90/00

OTHER PUBLICATIONS

Office Action issued in Taiwan Appl. No. 114103095 dated Aug. 13, 2025.

*Primary Examiner* — Michael T Tran
(74) *Attorney, Agent, or Firm* — Foley & Lardner LLP

(57) ABSTRACT

A memory system includes a first column of memory cells coupled to a first word line and a second a second column of memory cells coupled to a second word line. A first memory cell of the first column is in the same row as a second memory cell of the second column. The memory system includes a word line driver circuit configured to generate a select signal at the first word line to select the first memory cell and de-select the second memory cell.

20 Claims, 18 Drawing Sheets

1800

(56) References Cited

U.S. PATENT DOCUMENTS

| | | | | |
|---|---|---|---|---|
| 2019/0206489 | A1* | 7/2019 | Wang | G11C 13/0004 |
| 2021/0090651 | A1* | 3/2021 | Kim | G11C 13/0028 |
| 2021/0384353 | A1* | 12/2021 | Endo | H10D 86/423 |
| 2022/0068384 | A1* | 3/2022 | Han | G11C 13/0038 |
| 2022/0108757 | A1* | 4/2022 | Choi | G11C 7/1087 |
| 2022/0254413 | A1* | 8/2022 | Han | G11C 11/56 |
| 2022/0351790 | A1* | 11/2022 | Hsu | G11C 16/3459 |
| 2022/0392526 | A1* | 12/2022 | Yang | G11C 13/003 |
| 2023/0083548 | A1* | 3/2023 | Wei | G11C 11/2275 365/145 |

* cited by examiner

INTERLEAVED WORD LINES FOR MEMORY DEVICES

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
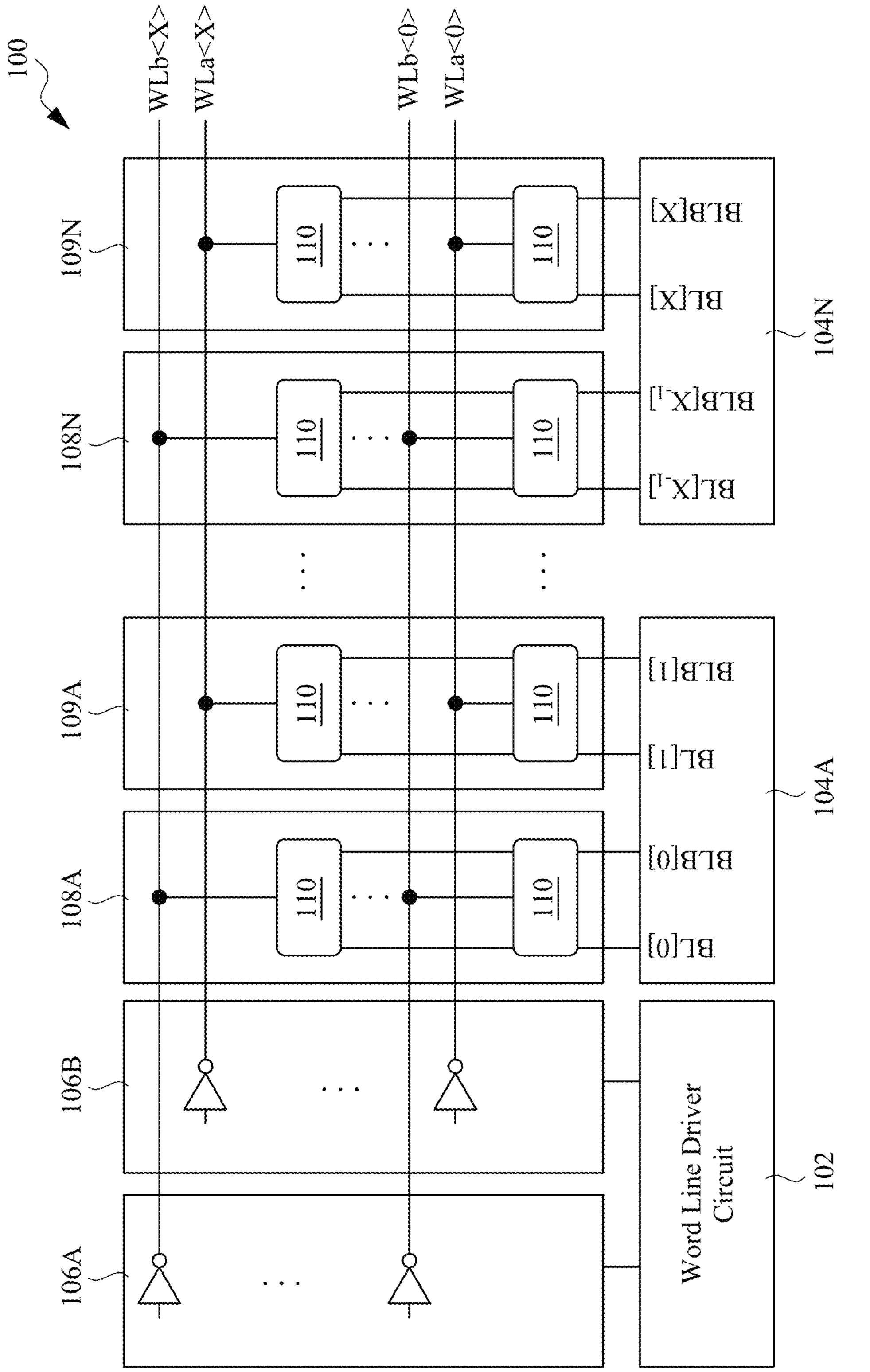
FIG. 1 illustrates a block diagram of an example memory system with interleaved word lines, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Memory arrays, including static random-access memory (SRAM) memory arrays, include multiple SRAM memory cells that are each capable of storing a bit of data. Memory cells in such arrays are organized in a grid-like structure with rows and columns, enabling efficient data access and storage. In traditional memory arrays, a single word line is shared across all memory cells in a row of the memory array. When a write operation is to be performed for a given memory cell is to be performed, the word line coupled to the memory cell is activated, while additional signals are provided to select the memory cell in the appropriate column for the write operation.

However, the shared word line configuration in conventional memory arrays can result in "dummy read" events or read/write disturbances in adjacent cells. A dummy read occurs when the act of writing data into one cell inadvertently causes other cells in the same row or column to be read. This unintended read can happen because the voltage fluctuations on the shared word line may disturb the state of neighboring cells. Similar read/write disturbances my occur during read/write operations for multiport memory devices that share read lines and/or word lines. As these issues inadvertently discharge certain bit lines in the memory array, additional power is consumed to pre-charge the bit lines for subsequent read operations. Likewise, read/write contention can occur in the event of read/write disturbances in adjacent cells, resulting in undefined behavior or an increase likelihood of device failure.

Embodiments of the present disclosure implement memory array circuits with interleaved word lines, such that adjacent memory cells in a row do not share a word line. Instead, at least two word lines are provided that are coupled to alternating memory cells in a row. When one of the interleaved word lines is activated for a write operation, the other word lines are deactivated, thereby preventing adjacent cells in the memory array from being partially activated. These improvements reduce the overall potential power consumption of the memory array while performing read/write operations.

FIG. 1 illustrates a block diagram of an example memory system 100 with interleaved word lines (e.g., WLa, WLb), in accordance with some embodiments. The memory system 100 can be included in any type of memory device or integrated circuit (IC) device. In at least one embodiment, a memory device is an individual IC device. In some embodiments, a memory device is included as a part of a larger IC device which comprises circuitry other than the memory device for other functionalities.

Each of the components shown in the memory system 100 may receive power from one or more voltage sources. The memory system 100 may include one or more logic gates and sub-circuits, each of which may be constructed from one or more logic gates. Logic gates are electronic devices that perform logical operations on one or more input signals to produce a single output signal. Various embodiments of the circuits and logic gates that implement the memory system 100 may include various transistors. The transistors described herein may have a certain type (n-type or p-type), but embodiments are not limited thereto. The transistors can be any suitable type of transistor including, but not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like.

It should be understood that the memory system 100 shown in FIG. 1 can be a portion of a larger memory circuit, including any number of pairs of bit lines BL and BLB or word lines WLa/WLb, which may be addressed by suitable memory cell control circuitry. Likewise, although not shown here for visual clarity, various additional circuitry may be included to address (e.g., select) various portions of the memory cells or to perform different memory operations, such write operations or read operations, among others.

The memory system 100 is shown as including a memory cell array of memory cells 110 arranged in rows and columns. Each memory cell is shown as being coupled between a pair of bit lines BL and BLB. In this example, the "BL[X]" and "BLB[X]" notation refers to the bit lines for the column "X." The memory cell 110 can be any type of memory device capable of storing at least one bit of memory data, including but not limited to an SRAM cell or a dynamic random-access memory (DRAM) cell, among others. The memory system 100 can include any number of first columns 108A-108N (sometimes referred to as "first column(s) 108") of memory cells 110 coupled to a first set of word lines 106A interleaved with a corresponding number of second columns 109A-109N (sometimes referred to as "second column(s) 109") of memory cells 110 coupled to a second set of word lines 106B.

Each first column 108 can be adjacent to at least one second column 109, such that first columns alternate with second columns 109 in the memory system 100. The first columns 108 and the second columns can be arranged such that no two first columns 108 and no two second columns 109 are adjacent to one another. In some implementations, each pair of first columns 108 and second columns 109 can be coupled to one of a set of amplifier circuits 104A-104N (sometimes referred to as "amplifier circuit(s) 104" or "pre-charge circuit(s) 104"). In some implementations, more than two columns may be coupled to an amplifier circuit 104. In other implementations, each column (e.g., each first column 108 or second column 109) can be coupled to a respective amplifier circuit 104.

As shown in this example, an amplifier circuit 104 is coupled to the bit lines (e.g., BL[0], BLB[0], BL[1], BLB [1], etc.) for a given pair of first columns 108 and second columns 109. The amplifier circuit 104 can include any type of circuitry to charge the bit lines BL and BLB to a predetermined voltage (e.g., about the supply voltage) for write operations and/or read operations. Although not shown here for visual clarity, in some implementations, multiple memory cells 110 may be arranged in any number of rows and coupled to each of a corresponding pair of bit lines BL[X] and BLB[X]. The amplifier circuits 104 may include sense amplifiers that detect small voltage differences imparted by the memory cells 110 on the bit lines BL and BLB during read operations. The sense amplifiers can amplify the detected voltage differences to a full logic level, providing output signals for the read operation.

Individual memory cells 110 of the memory array can be addressed by accessing corresponding bit lines BL and BLB (to select by column) and/or corresponding word lines WL or source lines (to select by row). Addressed memory cells can be selected for write and/or read operations. Signals that select memory cells and coordinate read/write operations can be provided by a memory control circuit coupled to, or forming a part of, the memory system 100. The memory control circuit may include any type of control circuit that provides signals to coordinate read or write operations via the circuitry of the memory system 100. In some implementations, one or more components of the memory system 100 may form at least a part of a memory control circuit.

The memory system 100 is shown as including at least one word line (WL) driver circuit 102, which can generate signals on a first word line(s) 106A and a second word line(s) 106B (sometimes generally referred to as the "word line(s) 106"). As shown, the first word lines 106A and the second word lines 106B can include one or more inverters or buffers to drive voltages to activate (and turn on) access transistors in the memory cells 110. The first word lines 106A are coupled to the memory cells 110 of the first columns 108 and the second word lines 106B are coupled to the memory cells 110 of the second columns 109. In some implementations, multiple word line driver circuits 102 can be included in the memory system 100. For example, in some implementations, a respective word line driver circuit 102 can be coupled to each word line 106.

The word line driver circuits 102 can include transistors, logic gates, or other electronic components that generate an appropriate logic signal on a corresponding word line to address one or more memory cells 110 during a read or write operation. The word line driver circuit 102 can be coupled to a memory control circuit, which provides signals that control which word lines 106A or 106B are to be activated to perform one or more memory operations. When a particular row of memory cells 110 is to be accessed, the word line driver circuit 102 receives one or more corresponding address/control signals from the memory control circuit and uses circuitry such as charge pumps or voltage regulators to generate and maintain the voltage on the corresponding word line(s) 106. Activation of the word line 106 can cause the selected memory cell(s) to become connected to their respective bit lines BL and BLB, enabling a corresponding amplifier circuit 104 to perform the memory operation via the corresponding set of bit lines BL and BLB.

Figure 2:
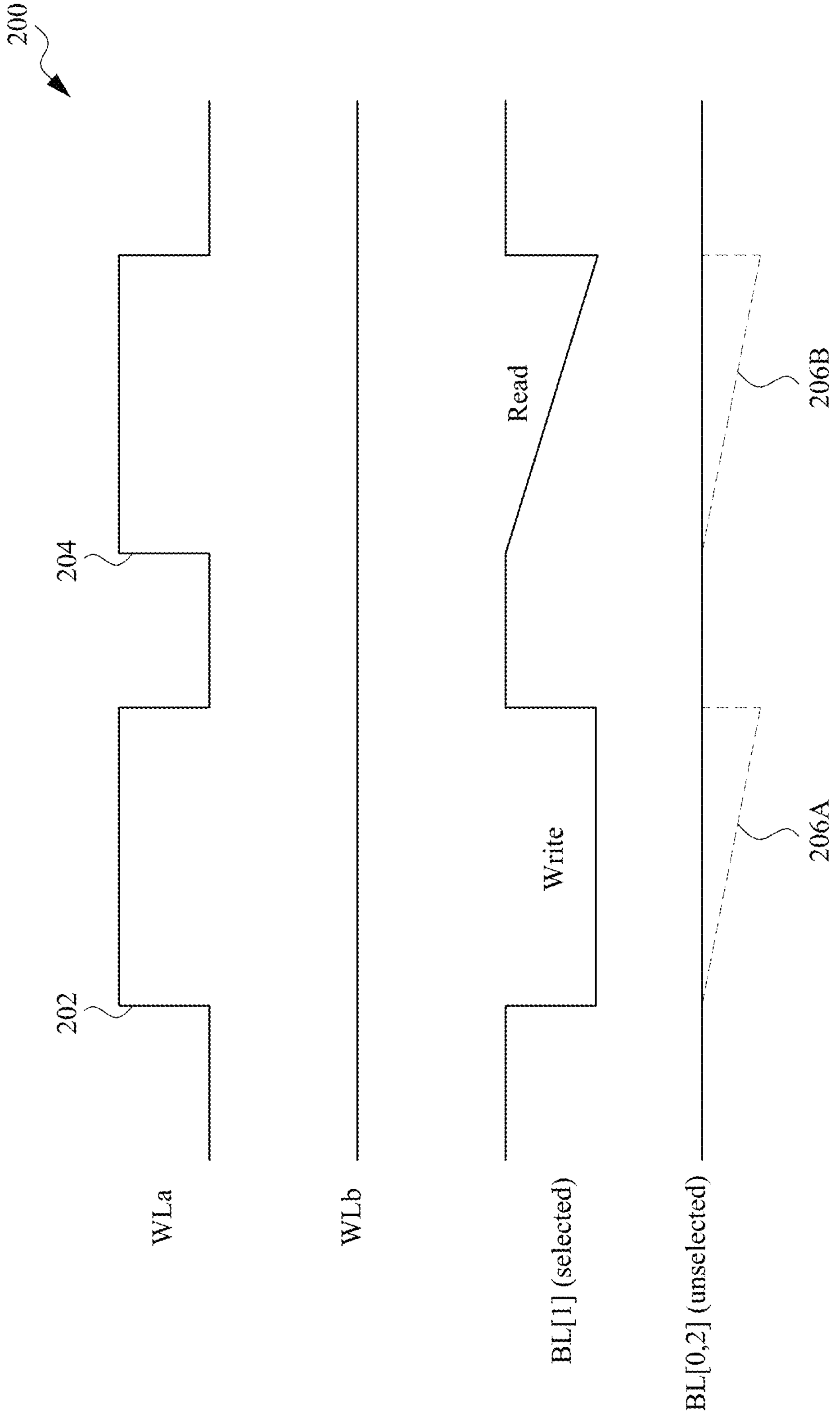
FIG. 2 illustrates a diagram of example waveforms that may propagate through the memory system of FIG. 1, in accordance with some embodiments.

Referring to FIG. 2 in the context of the components described in connection with FIG. 1, illustrated is a diagram 200 of example waveforms that may propagate through the memory system of FIG. 1, in accordance with some embodiments. In this example, two memory operations are performing in a column coupled to a bit line BL[1] in a memory system similar to the memory system 100 of FIG. 1. As shown, a first word line (WLa) is activated at the time steps 202 and 204 to perform a write operation and a read operation, respectively. The second word line (WLb) is maintained in a logic low state, such that the first columns 108 remain unselected and electrically decoupled from the corresponding bit lines.

In this example, the memory cells 110 being accessed are included in a column coupled to the bit lines BL[1] and BLB[1]. As shown, during the write operation starting at time 202, the bit line BL[1] is set to a logic low state (e.g., by the amplifier circuit 104). During the read operation starting at time 204, the bit line BL[1] is affected by the voltage of the memory cell 110, and begins to discharge. During each of these memory operations, the bit lines BL[0] and BL[2] of the adjacent columns the in the memory array remain constant and unaffected by activation of the word line WLa. The waveforms 206A and 206B reflect signals that would propagate in conventional memory arrays under similar circumstances. As shown, in memory circuits that share a single word line across all columns in a memory array, dummy reads can occur resulting in decreased voltage (and increased charge time) for adjacent memory cells during read and write operations. These dummy reads are mitigated using the memory arrays described herein.

Figure 3:
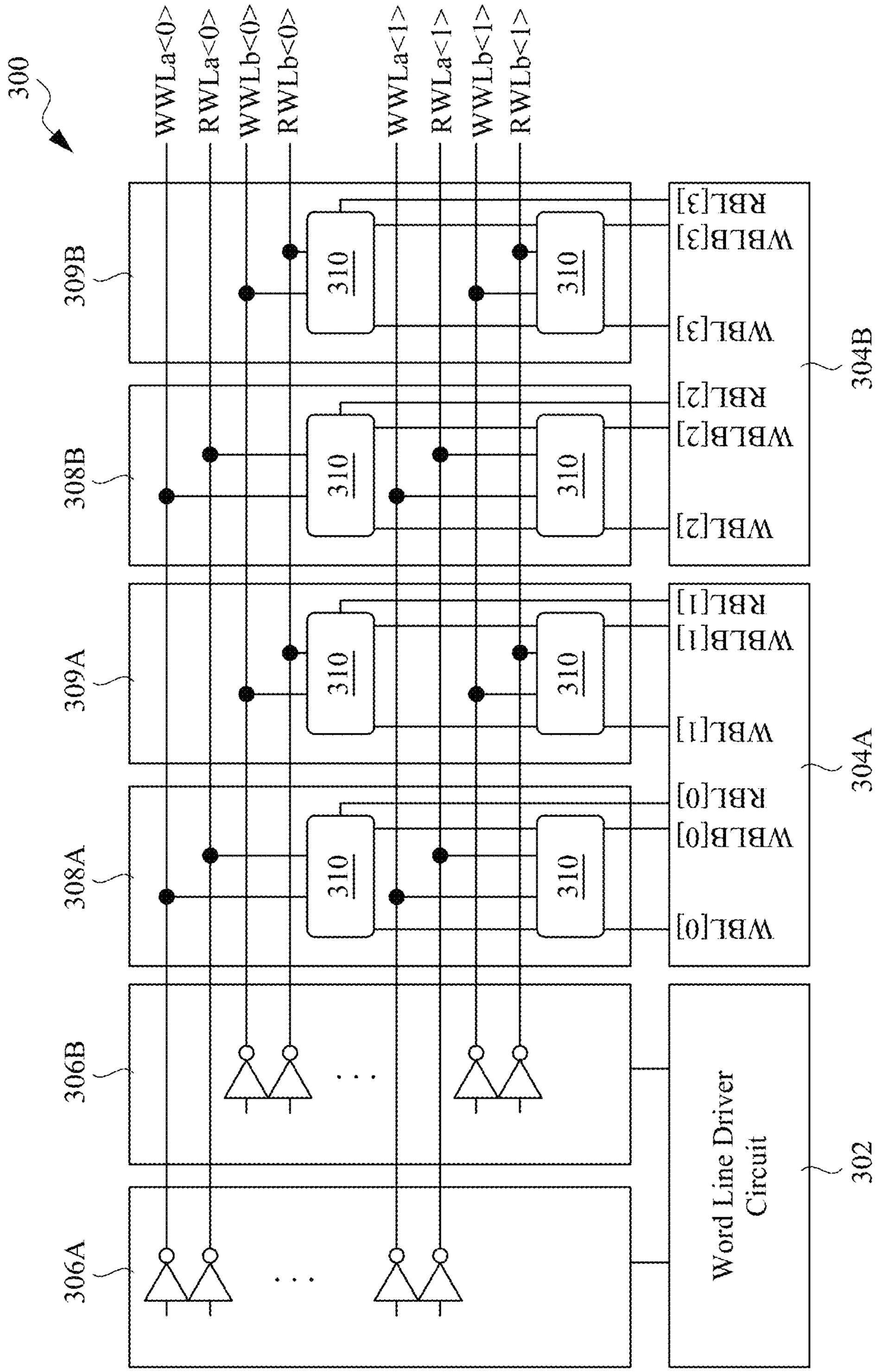
FIG. 3 illustrates a diagram of an example multiport memory system with interleave word lines, in accordance with some embodiments.

FIG. 3 illustrates a diagram of an example multiport memory system 300 with interleave word lines, in accordance with some embodiments. The memory system 100 can be included in any type of memory device or IC device. In at least one embodiment, a memory device is an individual IC device. In some embodiments, a memory device is included as a part of a larger IC device which comprises circuitry other than the memory device for other functionalities.

Each of the components shown in the memory system 300 may receive power from one or more voltage sources. The memory system 300 may include one or more logic gates and sub-circuits, each of which may be constructed from one or more logic gates. Logic gates are electronic devices that perform logical operations on one or more input signals to produce a single output signal. Various embodiments of the circuits and logic gates that implement the memory system 300 may include various transistors. The transistors described herein may have a certain type (n-type or p-type), but embodiments are not limited thereto. The transistors can be any suitable type of transistor including, but not limited to, MOSFET, CMOS transistors, PMOS, NMOS, BJT, high voltage transistors, high frequency transistors, PFETs/NFETs, FinFETs, planar MOS transistors with raised source/drains, nanosheet FETs, nanowire FETs, or the like.

It should be understood that the memory system 300 shown in FIG. 3 can be a portion of a larger memory circuit, including any number of pairs of bit lines BL and BLB, write word lines WWLa/WWLb, or read word lines RWLa/RWLb, which may be addressed by suitable memory cell control circuitry. Likewise, although not shown here for visual clarity, various additional circuitry may be included to address (e.g., select) various portions of the memory cells or to perform different memory operations, such write operations or read operations, among others.

The memory system 300 can be similar to and may include any of the structure or implement any of the functionality of the memory system 100 described in connection with FIG. 1. The memory system 300 is shown as including a memory cell array of memory cells 310 arranged in rows and columns. Each memory cell 310 is shown as being coupled between a pair of bit lines BL and BLB. The memory cell 310 can be similar to the memory cells 110 of FIG. 1. The memory system 300 can include any number of first columns 308A-308B (sometimes referred to as "first column(s) 308") of memory cells 310 coupled to a first set of word lines 306A interleaved with a corresponding number of second columns 309A-309B (sometimes referred to as "second column(s) 309") of memory cells 310 coupled to a second set of word lines 306B.

The first set of word lines, in this example, are shown as including the write word lines WWLa and WWLb and the read word lines RWLa and RWLb. The write word lines WWLa and WWLb, when activated by the word line driver circuit 302, can select memory cells 310 in the first columns 308 and the second columns 309 for write operations, respectively. The read word lines RWLa and RWLb, when activated by the word line driver circuit 302, can select memory cells 310 in the first columns 308 and the second columns 309 for read operations, respectively. The memory cells 310 can be, in some implementations, multi-port (e.g., dual-port) memory cells with separate read and write input signals, accessed via the read word lines and the write word lines, respectively.

The first columns 308 and the second columns can be interleaved, such that no two first columns 308 and no two second columns 309 are adjacent to one another. In some implementations, each pair of first columns 308 and second columns 309 can be coupled to one of a set of amplifier circuits 304A-304N (sometimes referred to as "amplifier circuit(s) 304" or "pre-charge circuit(s) 304"). In some implementations, more than two columns may be coupled to an amplifier circuit 304. In other implementations, each column (e.g., each first column 308 or second column 309) can be coupled to a respective amplifier circuit 304. The amplifier circuits 304 can be similar to and implement any of the functionality of the amplifier circuits 104 of FIG. 1.

As shown, an amplifier circuit 304 is coupled to write bit lines (e.g., WBL[0], WBLB[0], WBL[1], WBLB[1], etc.) for a given pair of first columns 308 and second columns 309, similar to the bit lines BL and BLB as in the memory system 100 of FIG. 1. The write bit lines can be accessed or otherwise manipulated by the components of the memory system 300 to perform write operations in the memory array. Additionally, the amplifier circuit 304 can be coupled to one or more read bit lines (e.g., RBL[0], RLB[1], etc.), which operate as bit lines for read operations. The voltage drop at the read bit lines can be monitored by the circuitry of the amplifier circuit 304 to perform read operations. In this example, the memory cells 310 are implemented as dual port memory devices.

Individual memory cells 310 of the memory array can be addressed by accessing corresponding write bit lines WBL and WBLB, read bit lines RBL, and/or corresponding read or write word lines WWL or RWL. Signal(s) that select memory cells and coordinate read/write operations can be provided by a memory control circuit coupled to, or forming a part of, the memory system 300. The memory control circuit may include any type of control circuit that provides signals to coordinate read or write operations via the circuitry of the memory system 300. In some implementations, one or more components of the memory system 300 may form at least a part of a memory control circuit.

The memory system 300 is shown as including at least one word line (WL) driver circuit 302, which can generate signals on a first word line(s) 306A and a second word line(s) 306B (sometimes generally referred to as the "word line(s) 306"). The first word lines 306A and the second word lines 306B can include one or more inverters or buffers to drive voltages to activate (and turn on) access transistors in the memory cells 310. The first word lines 306A are shown as including the write word lines WWLa<0> (first row) and WWLa<1> (second row) and the read word lines RWLa<0> and RWLa<1>. The second word lines 306B are shown as including the write word lines WWLb<0> (first row) and WWLb<1> (second row) and the read word lines RWLb<0> and RWLb<1>. Any number of read word lines and write word lines can be included in the memory system 300.

The first word lines 306A are coupled to the memory cells 310 of the first columns 308 and the second word lines 306B are coupled to the memory cells 310 of the second columns 309. In some implementations, multiple word line driver circuits 302 can be included in the memory system 300. For example, in some implementations, a respective word line driver circuit 302 can be coupled to each of the first word lines 306A and the second word lines 306B. The word line driver circuit 302 can be similar to and implement any of the functionality of the word line driver circuit 102 of FIG. 1. Additionally, the word line driver circuit 302 can activate appropriate read word lines RWL in response to signal(s) from a memory control circuit to turn on access transistor(s) of selected memory cell(s) 310 for read operations.

Figure 4:
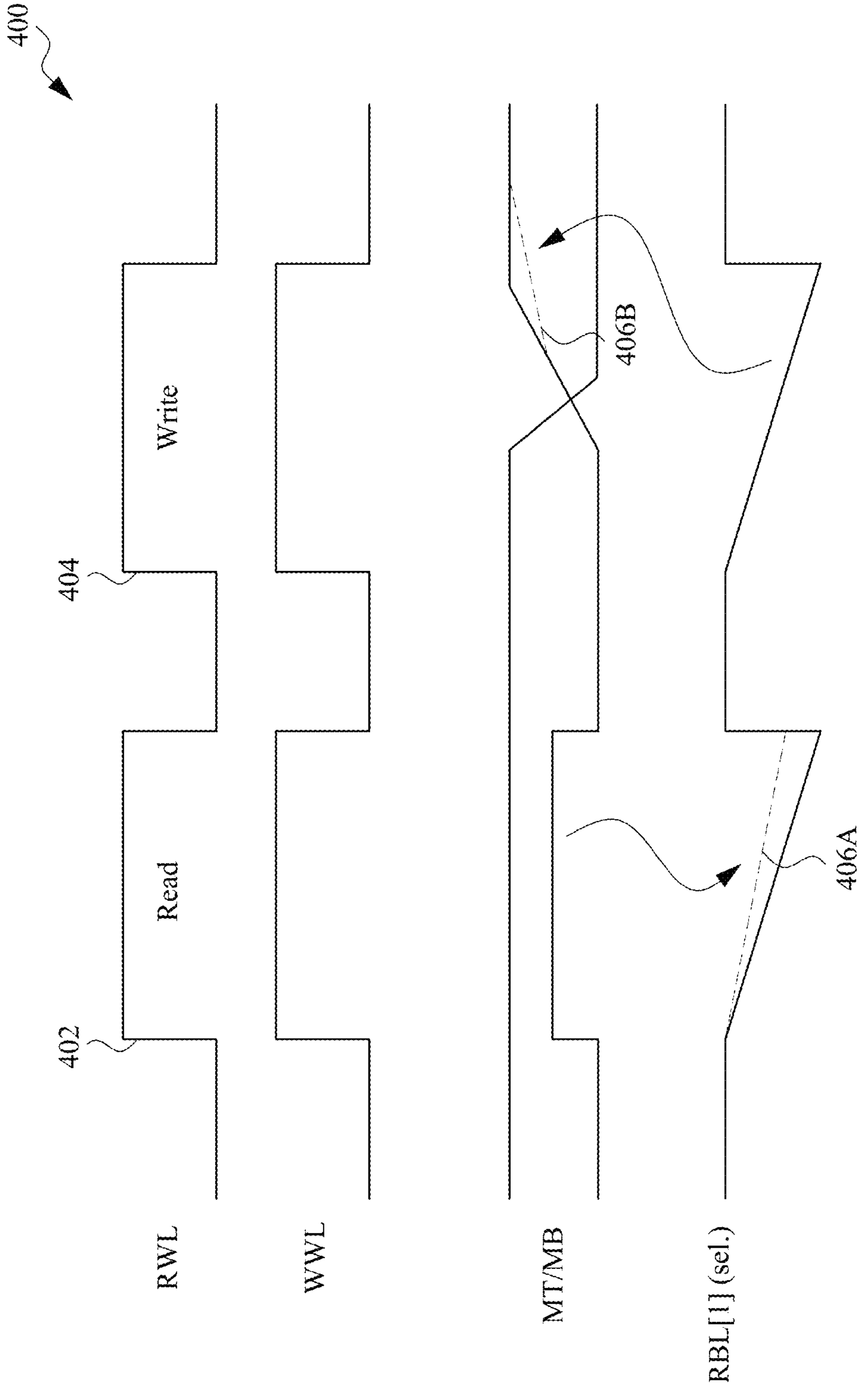
FIG. 4 illustrates a diagram of example waveforms that may propagate through the memory system of FIG. 3, in accordance with some embodiments.

FIG. 4 in the context of the components described in connection with FIG. 3, illustrated is a diagram 400 of example waveforms that may propagate through the memory system of FIG. 3, in accordance with some embodiments. In this example, two memory operations are performing in a column coupled to a read bit line RBL[1] in a memory system similar to the memory system 300 of FIG. 3. As shown, a read word line (RWL) and a write word line WWL are activated at the time steps 402 and 404 to perform a read operation and a write operation, respectively.

As shown, during the read operation starting at time 202, internal nodes MT and MB of the selected memory cell 310 cause the transistors of the memory cell 310 to discharge the read bit line RBL[1]. The dashed waveform 406A reflects a signal that would propagate in conventional memory arrays under similar circumstances. In particular, the rate at which the bit line RBL[1] discharges is relatively slower compared with the circuits described herein, resulting in a read disturbance that decreases device performance.

During the write operation starting at time 204, the voltages of the internal MT/MB nodes are swapped (e.g., based on signals provided by the write bit lines WBL[1] and WBLB[1]), indicating information has been written to the memory cell. The waveform 406B reflects a signal that would propagate in conventional memory arrays under similar circumstances. In particular, the MB node would charge to about the supply voltage at a lower rate, resulting in a write disturbance that increases the power needed to perform write operations and increases the amount of time needed to perform write operations.

Figure 5:
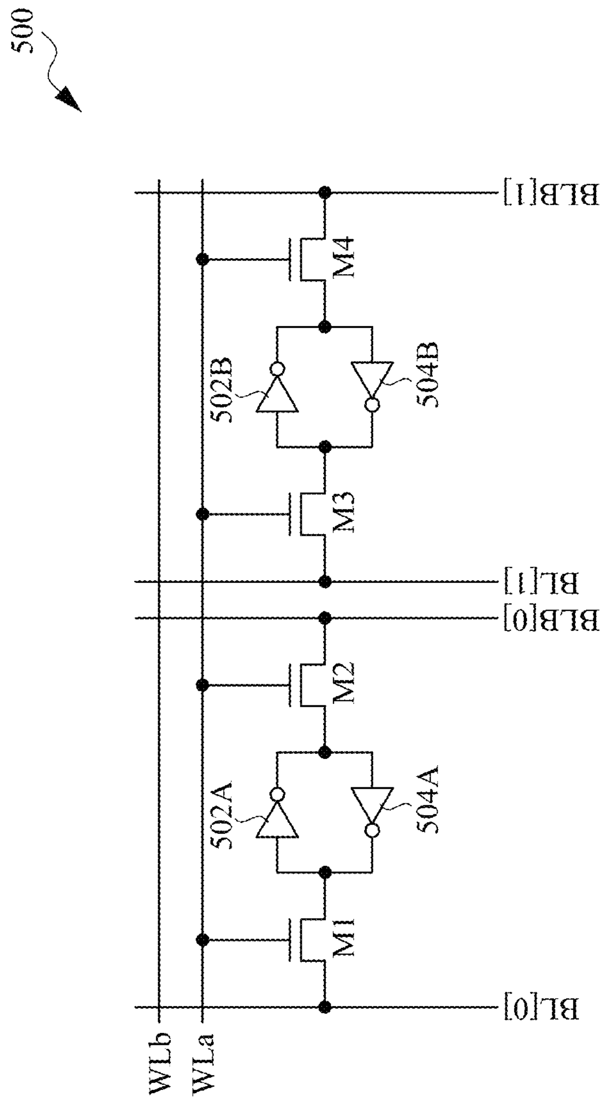
FIG. 5 illustrates a diagram of an example memory circuit with two interleaved word lines, in accordance with some embodiments.

Referring to FIG. 5, illustrated is a diagram of an example memory circuit 500 with two interleaved word lines, in accordance with some embodiments. The memory circuit 500 is shown as including two memory cells. A first memory cell includes the cross-coupled inverters 502A and 504A and a second memory cell includes the cross-coupled inverters 502B and 504B. The memory circuit 500 is shown as including the transistors M1, M2, M3, and M4. Although each of the transistors M1-M4 of the memory circuit 500 are shown as one transistor, embodiments are not limited thereto. For example, each of the transistors may include multiple transistors ("sub-transistor(s)") that are connected to one another in parallel. For example, in an embodiment, each of the sub-transistors of any transistor described herein can include respective gate, drain, and source terminals, each of which may be connected to one another in parallel.

In some implementations, the transistors M1, M2, M3, and M4 are nMOSFET transistors. It is appreciated that each of the transistors M1-M4 can include any of various other types of transistors (e.g., bipolar junction transistors, high-electron-mobility transistors, etc.) while remaining within the scope of the present disclosure. The first memory cell includes the transistors M1 and M2 and the second memory cell includes the transistors M3 and M4. A first source/drain terminal of the transistor M1 is coupled to the bit line BL[0] of the first memory cell. A second source/drain terminal of the transistor M1 is coupled to a first node of the cross coupled inverters 502A and 504A. A first source/drain terminal of the transistor M2 is coupled to the reference bit line BLB[0] of the first memory cell. A second source/drain terminal of the transistor M2 is coupled to a second node of the cross coupled inverters 502A and 504A.

A first source/drain terminal of the transistor M3 is coupled to the bit line BL[1] of the second memory cell. A second source/drain terminal of the transistor M3 is coupled to a first node of the cross coupled inverters 502B and 504B. A first source/drain terminal of the transistor M4 is coupled to the reference bit line BLB[1] of the second memory cell. A second source/drain terminal of the transistor M4 is coupled to a second node of the cross coupled inverters 502B and 504B. In this example, the memory cells of the memory circuit 500 are included in the same row and are coupled to two word lines WLa and WLb.

The gate terminals of the transistors M1 and M2 are coupled to a first word line WLa. The gate terminals of the transistors M3 and M4 are coupled to a second word line WLb. The transistors M1-M4 act as access transistors for the memory cells of the memory circuit 500. When a logic high voltage is propagated on the first word line WLa, the transistors M1 and M2 are turned on and conduct, electrically coupling the nodes of the cross-coupled inverters 502A and 504A to the bit lines BL[0] and BLB[0]. When a logic high voltage is propagated on the second word line WLb, the transistors M3 and M4 are turned on and conduct, electrically coupling the nodes of the cross-coupled inverters 502B and 504B to the bit lines BL[1] and BLB[1]. The second word line WLb can be in a logic low state when the first word line WLa is in a logic high state, and vice-versa.

Although two memory cells are included in this example, it should be understood that any number of memory cells can be included as part of the memory circuit 500. For example, multiple memory cells may be included in the same column (e.g., coupled to bit lines BL[0] and BLB[0]) as the first memory cell. Each memory cell in the column may coupled to its own respective word line. Additionally, other memory cells may be included in the same row as the first and second memory cells. As in FIGS. 1 and 3, the first word line WLa and the second word line WLb can be coupled to every other memory cell in the row, such that word line access for the word lines WLa and WLb are interleaved between each column in the memory array.

Figure 6:
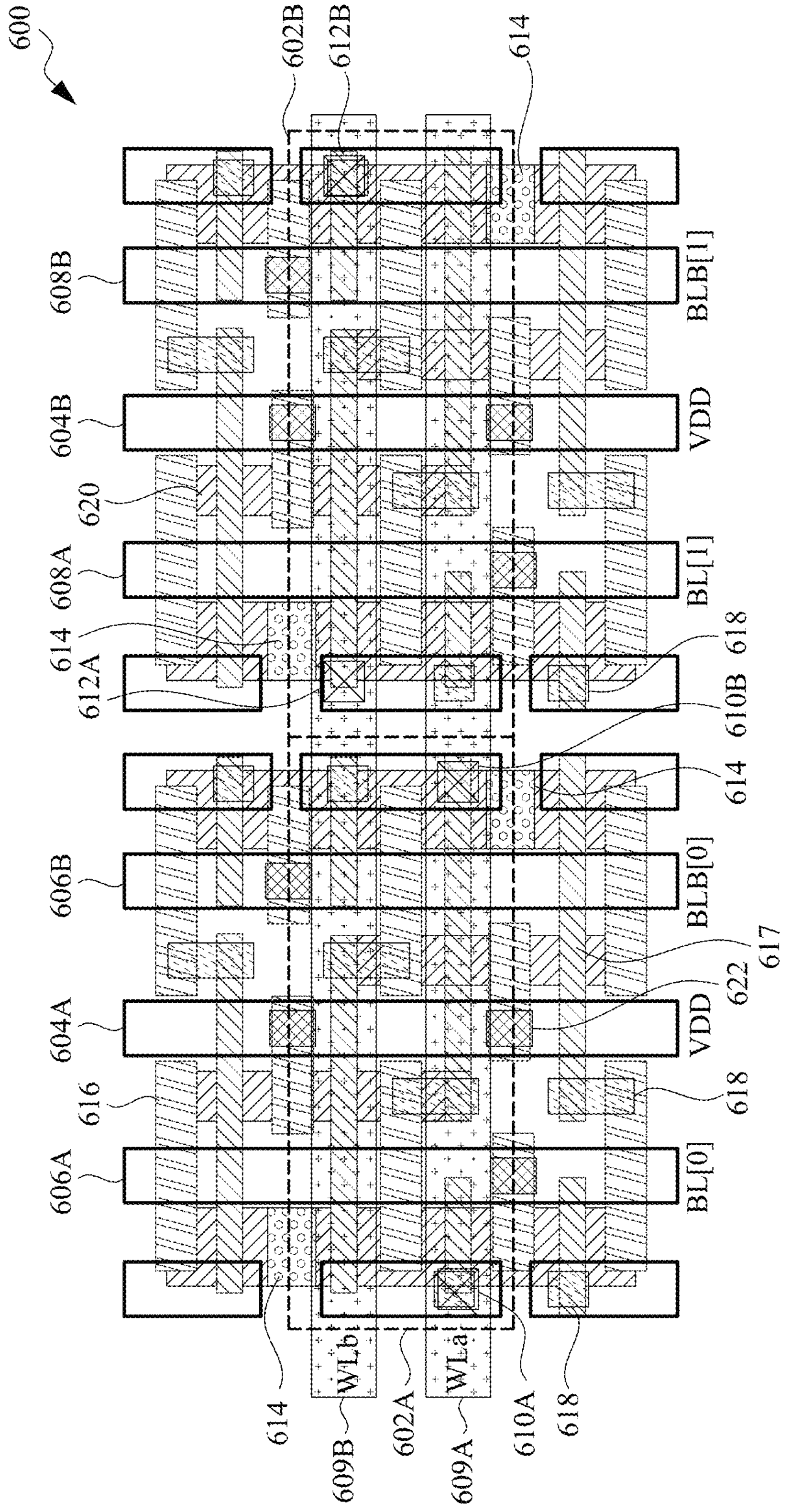
FIG. 6 illustrates a block diagram showing an example semiconductor layout of the memory circuit shown in FIG. 5, in accordance with some embodiments.

Referring to FIG. 6, illustrated is a block diagram showing an example semiconductor layout 600 of the memory circuit shown in FIG. 5, in accordance with some embodiments. The example layout 600 is a top-down layout showing multiple active regions 620, which in this example extend vertically. For ease of visualization, like patterns in FIG. 6 correspond to like material structures, and some reference numbers have been omitted in the interest of visual clarity of the semiconductor layout. In the example shown in FIG. 6, two memory cells 602A and 602B are shown, which can correspond to the first and second memory cells shown in the memory circuit 500 of FIG. 5. Each memory cell 602A and 602B can include four vertical active regions 620, as shown.

The active regions 620 may sometimes be referred to herein as the OD regions 620. The OD regions 620 may include any suitable semiconductor material, for example, silicon. Alternatively, the OD regions 620 may include other elementary semiconductor material such as, for example, germanium. The active regions 620 may also include a compound semiconductor such as silicon carbide, gallium arsenic, indium arsenide, and indium phosphide. The active regions 620 may include an alloy semiconductor such as silicon germanium, silicon germanium carbide, gallium arsenic phosphide, and gallium indium phosphide. In one embodiment, the active regions 620 includes an epitaxial layer. For example, the substrate may have an epitaxial layer overlying a bulk semiconductor. Furthermore, the active regions 620 may include a semiconductor-on-insulator (SOI) structure.

As shown, each of the active regions 620 extend along vertically as continuous regions of material, upon which one or more PMOS and/or NMOS transistors are defined. Transistors are defined on the active regions 620 in regions intersected by the metal gate structure(s) 617. As shown, the metal gate structures 617 extend horizontally and substantially perpendicular to the active regions 620. Metal material of the gate structures 617 can be separated from the active regions 620 by a thin layer of a dielectric material, which in some implementations may be a high-k dielectric material. The gate structures 617 described herein may therefore include multiple layers, for example, a gate dielectric layer and a gate metal. Any suitable material may be utilized to form the gate metal of the gate structures described herein, including, for example, polysilicon (PO), or any other metal material described herein.

The transistors formed using the gate structures 617 and the active regions 620 include source/drain region(s). The source/drain regions may be doped portions of the active regions 620 adjacent to the portions overlapped by the gate structures 617. The source/drain regions are shown as coupled to corresponding metal source/drain structures 616, which may be used to route signals from the source/drain regions of the transistors to other portions of the memory circuit 600. The metal source/drain structures 616 may include any type of conductive material, including but not limited to aluminum, tungsten, tungsten nitride, copper, cobalt, silver, gold, chrome, ruthenium, platinum, titanium, titanium nitride, tantalum, tantalum nitride, nickel, hafnium, alloys, and combinations thereof.

The metal source/drain structures 616 are coupled to other metal layers of the memory circuit 600 via the source/drain-to-metal via connections 622. The source/drain-to-metal via connections 622 can be any type of metal structure with a conductive via. The source/drain-to-metal via connections 622 can include but is not limited to aluminum, tungsten, tungsten nitride, copper, cobalt, silver, gold, chrome, ruthenium, platinum, titanium, titanium nitride, tantalum, tantalum nitride, nickel, hafnium, alloys, and combinations thereof. The gate structures 617 are coupled to other metal layers of the memory circuit 600 via the gate-to-metal via connections 618. The gate-to-metal via connections 618 can be any type of metal structure with a conductive via. The gate-to-metal via connections 618 can include but is not limited to aluminum, tungsten, tungsten nitride, copper, cobalt, silver, gold, chrome, ruthenium, platinum, titanium, titanium nitride, tantalum, tantalum nitride, nickel, hafnium, alloys, and combinations thereof.

The bit lines BL and BLB (shown as the first bit lines BL[0] and BLB[0] and the second bit lines BL[1] and BLB[1]) are coupled to metal source/drain structures 616 of the access transistors of the memory cells. The first bit lines BL[0] and BLB[0] are defined as the vertical metal rails 606A and 606B. The second bit lines BL[1] and BLB[1] are defined as the vertical metal rails 608A and 608B. Power can be supplied (e.g., a supply voltage) to the first and second memory cells using the vertical metal rails 604A and 604B, respectively. The metal rails 604A-608B may be defined on as part of one or more metal layers formed above the metal source/drain structures 616 and the gate structures 617.

As shown, the word lines WLa and WLb are defined by two metal rails 609A and 609B, which extend substantially perpendicular to the active regions 620. The metal rails 609A and 609B can be defined as part of one or more metal layers formed above the metal layers that define the metal rails 604A-608B. The metal rails 609A and 609B can be coupled to the gate terminals of the memory cells using corresponding word line via connections 610A, 610B, 612A, and 612B. The metal rails 609A and 609B and the word line via connections 610A, 610B, 612A, and 612B can include but are not limited to aluminum, tungsten, tungsten nitride, copper, cobalt, silver, gold, chrome, ruthenium, platinum, titanium, titanium nitride, tantalum, tantalum nitride, nickel, hafnium, alloys, and combinations thereof.

In this example, the metal rail 609A defining the first word line WLa is coupled to the gate terminals of the access transistors of the first memory cell 602A by way of the word line via connections 610A and 610B. As shown, the word line via connections 610A and 610B are coupled to the gate structures 617 of the access transistors through a layer of metal material beneath the metal rail 609A. The metal material can be formed from the same metal layer as the bit lines 606A and 606B and the metal rail 604A, and can be coupled to the gate terminal via a metal-to-gate via connection 618.

The metal rail 609B defining the second word line WLb is coupled to the gate terminals of the access transistors of the second memory cell 602B by way of the word line via connections 612A and 612B. As shown, the word line via connections 612A and 612B are coupled to the gate structures 617 of the access transistors through a layer of metal material beneath the metal rail 609B. The metal material can be formed from the same metal layer as the bit lines 608A and 608B and the metal rail 604B, and can be coupled to the gate terminal via a metal-to-gate via connection 618. Although two memory cells 602A and 602B are shown here, it should be understood that any number of memory cells may be provided in the same row of the memory array.

The semiconductor layout 600 can be coupled to a ground voltage via a backside power delivery technique. The backside power delivery in this example is shown as being provided by the power connections 614. Although shown as being formed above the active region 620 for visual clarity, it should be understood that the power connection 614 to the ground voltage is provided beneath the source/drain node(s) of the corresponding transistor(s) of the memory cells 602A and 602B. The power connection 614 may be provided via a backside-contact-on-silicon (BSC-S) technique, in some implementations.

Figure 7:
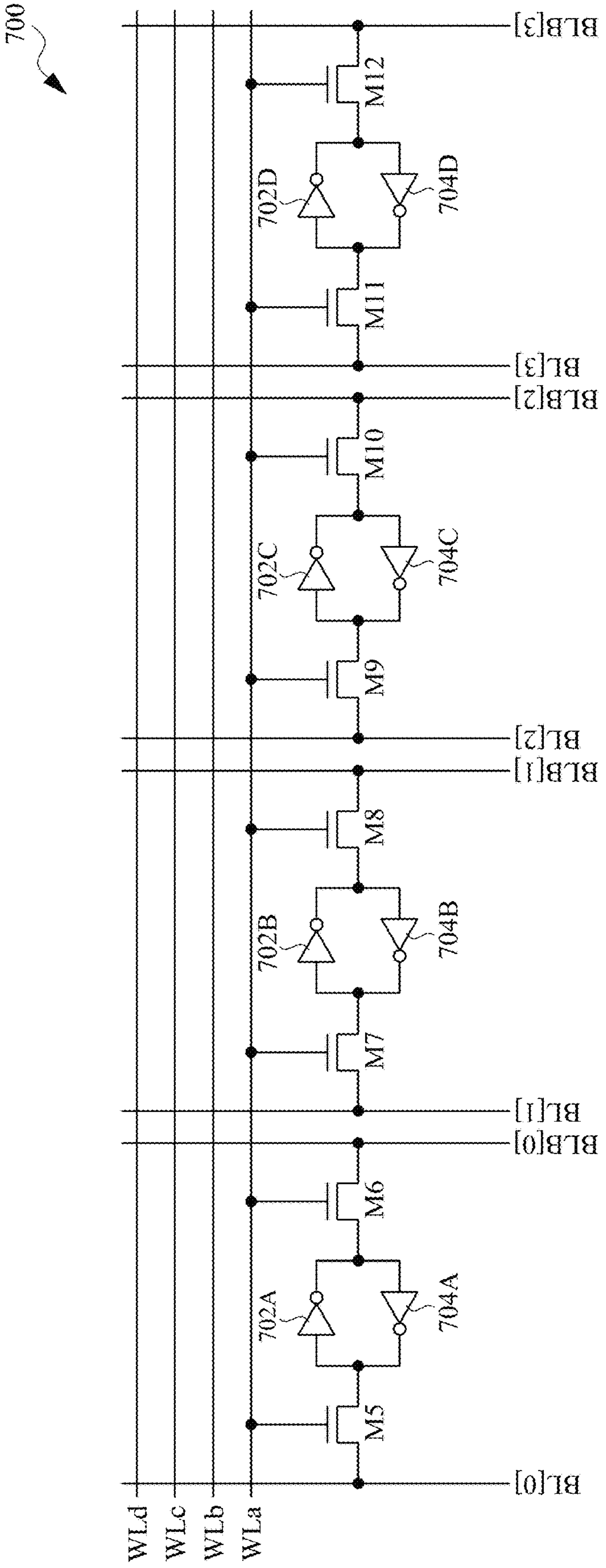
FIG. 7 illustrates a diagram of an example memory circuit with four interleaved word lines, in accordance with some embodiments.

Referring to FIG. 7, illustrated is a diagram of an example memory circuit 700 with four interleaved word lines WLa, WLb, WLc, and WLd, in accordance with some embodiments. The memory circuit 700 is shown as including two memory cells. A first memory cell includes the cross-coupled inverters 702A and 704A, a second memory cell includes the cross-coupled inverters 702B and 704B, a third memory cell includes the cross-coupled inverters 702C and 704C, and a fourth memory cell includes the cross-coupled inverters 702D and 704D. The memory circuit 700 is shown as including the transistors M5, M6, M7, M8, M9, M10, M11, and M12. Although each of the transistors M5-M12 of the memory circuit 700 are shown as one transistor, embodiments are not limited thereto. For example, each of the transistors may include multiple transistors ("sub-transistor(s)") that are connected to one another in parallel. For example, in an embodiment, each of the sub-transistors of any transistor described herein can include respective gate, drain, and source terminals, each of which may be connected to one another in parallel.

In some implementations, the transistors M5, M6, M7, M8, M9, M10, M11, and M12 are nMOSFET transistors. It is appreciated that each of the transistors M5-M12 can include any of various other types of transistors (e.g., bipolar junction transistors, high-electron-mobility transistors, etc.) while remaining within the scope of the present disclosure. The first memory cell includes the transistors M5 and M6, the second memory cell includes the transistors M7 and M8, the third memory cell includes the transistors M9 and M10, and the fourth memory cell includes the transistors M11 and M12. A first source/drain terminal of the transistors M5, M7, M9, and M11 is coupled to the bit lines BL[0], BL[1], BL[2], and BL[3] of the first, second, third, and fourth memory cells, respectively. A second source/drain terminal of the transistors M5, M7, M9, and M11 is coupled to a first node of the cross coupled inverters of the first, second, third, and fourth memory cells, respectively. A first source/drain terminal of the transistors M6, M8, M10, and M12 is coupled to the reference bit lines BLB[0], BLB[1], BLB[2], and BLB[3] of the first, second, third, and fourth memory cells, respectively. A second source/drain terminal of the transistors M6, M8, M10, and M12 is coupled to a second node of the cross coupled inverters of the first, second, third, and fourth memory cells, respectively.

In this example, the memory cells of the memory circuit 700 are included in the same row and are coupled to four word lines WLa, WLb, WLc, and WLd. The gate terminals of the transistors M5 and M6 are coupled to the first word line WLa. The gate terminals of the transistors M7 and M8 are coupled to the second word line WLb. The gate terminals of the transistors M9 and M10 are coupled to the third word line WLc. The gate terminals of the transistors M11 and M12 are coupled to the fourth word line WLd. The transistors M5-M12 act as access transistors for the memory cells of the memory circuit 700, similar to the circuit described in connection with FIG. 5.

Figure 8:
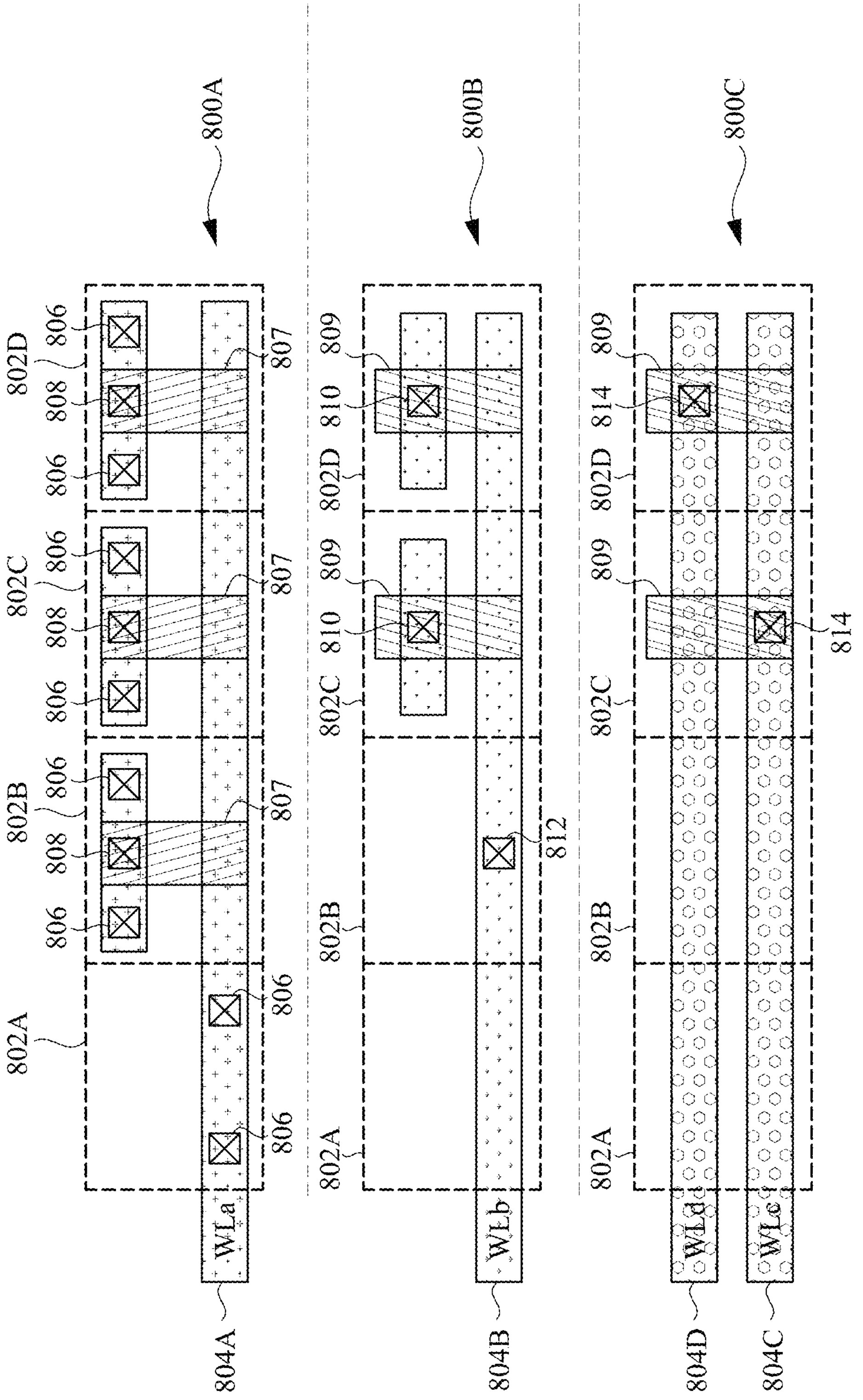
FIG. 8 illustrates a block diagram showing example word line connections for a semiconductor layout of the memory circuit shown in FIG. 7, in accordance with some embodiments.

Referring to FIG. 8 in the context of the components described in connection with FIG. 7, illustrated are a block diagrams 800A, 800B, and 800C showing example word line connections for a semiconductor layout of the memory circuit shown in FIG. 7, in accordance with some embodiments. In this example, layouts for metal layers that define connections between the gate terminals of the transistors M5-M12 of FIG. 7 are shown. Like the circuit in FIG. 7, layouts for four memory cells 802A, 802B, 802C and 802D are shown. The word lines WLa, WLb, WLc, and WLc are shown as defined on different metal layers. The first metal layer 804A corresponds to first word line WLa and provides a set of three regions in parallel with the first word line WLa that couple the upper layers to the transistors of the memory cells 802B, 802C, and 802D.

As shown, the first metal layer 804A includes a first set of conductive vias 806, which can include but is not limited to aluminum, tungsten, tungsten nitride, copper, cobalt, silver, gold, chrome, ruthenium, platinum, titanium, titanium nitride, tantalum, tantalum nitride, nickel, hafnium, alloys, and combinations thereof. The first set of conductive vias 806 can extend downward and be coupled to the gate structures of the access transistors of the memory cells 802A-802D, as described herein. The first metal layer 804A can be positioned in a similar location and orientation as the metal rails 609A and 609B of FIG. 6. In some implementations, the first set of conductive vias 806 can be electrically coupled to another metal layer beneath the first metal layer 804*a*, which is electrically coupled to the gate structures of the access transistors of the memory cells 802A-802D.

To provide connections to upper metal layers, regions of a second metal layer 807 are provided that extend perpendicular to the rails defined by the first metal layer 804A. The regions of the second metal layer 807 are shown as including a second set of conductive vias 808, which can be similar to the first conductive vias 806. The second metal layer 807 can be formed on top of the first metal layer 804A and can be electrically coupled to the first metal layer 804A at the second set of conductive vias 808. As shown, the second set of conductive vias 808 are provided for each of the memory cells 802B, 802C, and 802D.

The block diagram 800B is shown as including the third metal layer 804B, which defines the second word line WLb, and is formed above the second metal layer 807. The third metal layer 804B includes a rail for the second word line WLb and two additional rails that provide further connections to an upper layer of metal material for the third and fourth word lines WLc and WLd. The third metal layer 804B is shown as including the third conductive via 812 and a set of fourth conductive vias 810. The third conductive via 812 extends downward and electrically couples the second word line WLb to the second metal layer 807, thereby electrically coupling the second word line WLb to the gate terminals of the access transistors of the second memory cell 802B.

A fourth metal layer 809 is provided above the third metal layer and includes a set of fourth conductive vias 810. The regions of the fourth metal layer 809 extends perpendicular to the regions of the third metal layer 804B, as shown. The set of fourth conductive vias 810 extend downward and electrically couple the regions of fourth metal layer 809 to the to the regions of the third metal layer 804B. Additionally, the set of fourth conductive vias 810 extend further downward to couple to the regions of the second metal layer 807, electrically coupling the regions of the fourth metal layer 809 to the gate terminals of the access transistors of the third and fourth memory cells 802C and 802D.

The block diagram 800C is shown as including a fifth metal layer defining the third word line 804C and the fourth word line 804D. The fifth metal layer is formed above the fourth metal layer 809. The fifth metal layer defining the third word line 804C and the fourth word line 804D includes a set of fifth conductive vias 814, which electrically couple the third word line 804C and the fourth word line 804D to corresponding regions of the fourth metal layer 809, thereby connecting the third word line 804C and the fourth word line 804D to the gate terminals of the access transistors of the third and fourth memory cells 802C and 802D, respectively.

Figure 9:
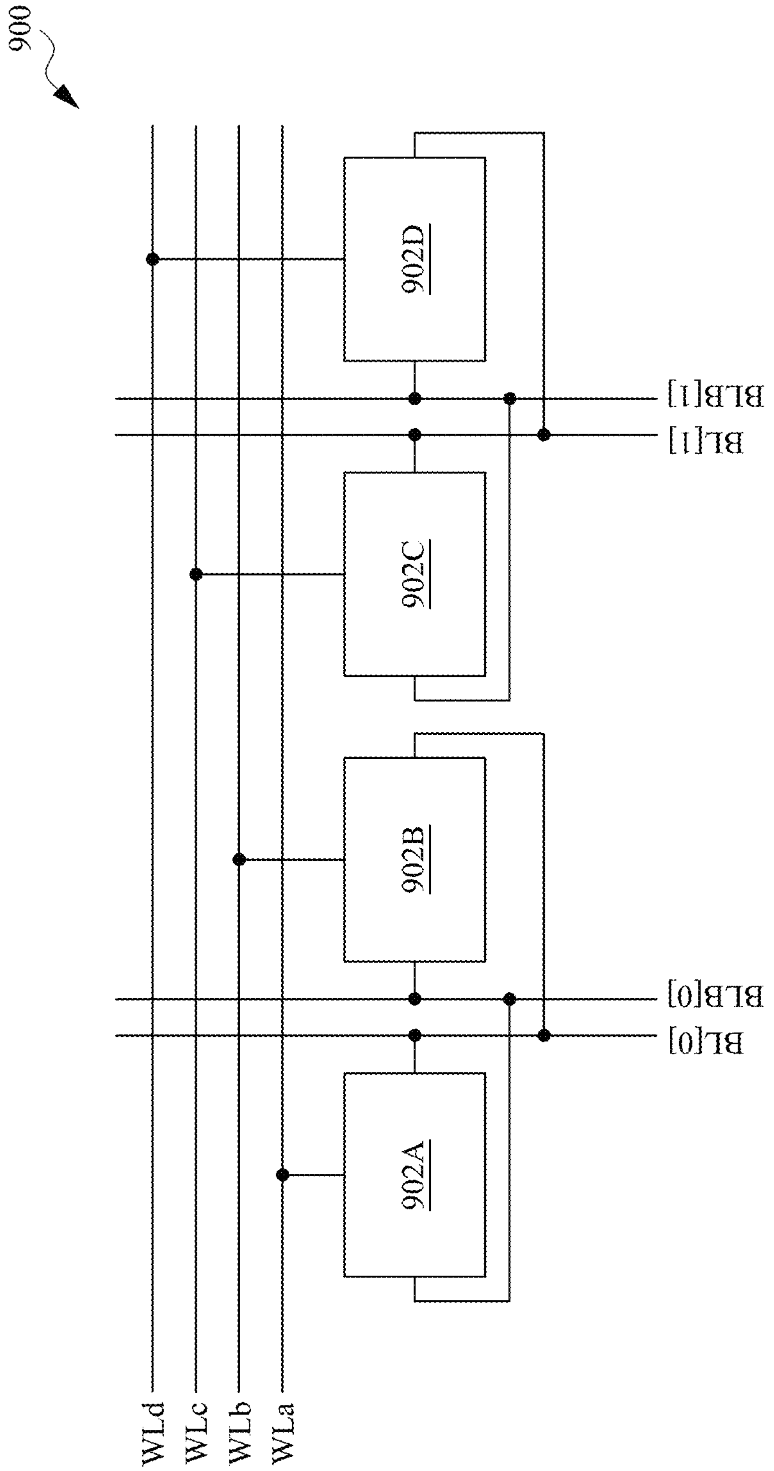
FIG. 9 illustrates a diagram of an example memory circuit including 4 Contacted Poly Pitch (4CPP) memory cells with four interleaved word lines, in accordance with some embodiments.

Referring to FIG. 9, illustrated is a diagram of an example memory circuit 900 including 4 Contacted Poly Pitch (4CPP) memory cells with four interleaved word lines WLa, WLb, WLc, and WLd, in accordance with some embodiments. The memory circuit 900 is shown as including the memory cells 902A, 902B, 902C, and 902D (sometimes referred to as "memory cell(s) 902"), each of which may be 4CPP SRAM cells. In this example, adjacent memory cells 902A and 902B share first bit lines BL[0] and BLB[0], and adjacent memory cells 902C and 902D share second bit lines BL[1] and BLB[1]. Access transistors of each of the memory cells 902A, 902B, 902C, and 902D are coupled to a respective one of the word lines WLa, WLb, WLc, and WLd, respectively. When a word line is activated, the access transistor of a respective memory cell 902 electrically couples the memory storage elements of the memory cell 902 to a set of bit lines, as described herein, enabling read or write operations to occur. The memory circuit 900 may be include any number of transistors, logic gates, or digital components to implement a memory array. In this example, each of the memory cells 902 are included in the same row of the memory array.

Figure 10:
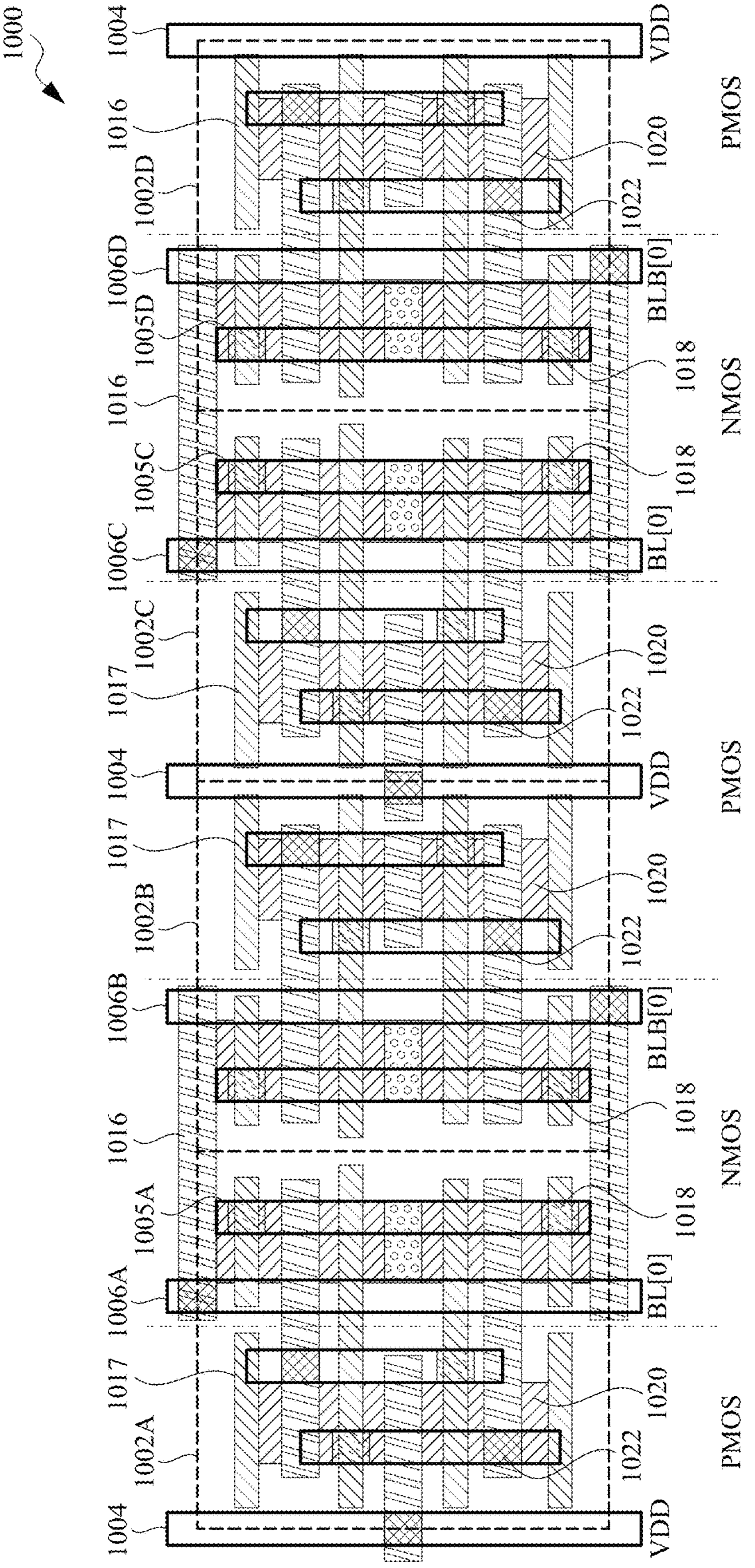
FIG. 10 illustrates a block diagram showing an example semiconductor layout of the memory circuit shown in FIG. 9, in accordance with some embodiments.

Referring to FIG. 10 in the context of the components of the components described in connection with FIG. 9, illustrated is a block diagram 1000 showing an example semiconductor layout of the memory circuit shown in FIG. 9, in accordance with some embodiments. The layout of FIG. 10 is similar to the layout shown in FIG. 6. For ease of visualization, like patterns in FIG. 10 correspond to like material structures, and some reference numbers have been omitted in the interest of visual clarity of the semiconductor layout. The example layout 1000 is a top-down layout showing multiple active regions 1020, which in this example extend vertically. In the example shown in FIG. 10, four memory cells 1002A, 1002B, 1002C, and 1002D are shown (sometimes referred to as the "memory cell(s) 1002"), which can correspond to the first, second, third, and fourth memory cells 902A-902D shown in the memory circuit 900 of FIG. 9. Each memory cell 1002 can include two vertical active regions 1020, as shown.

The active regions 1020 can be similar to the active regions 620 of FIG. 6 and may include any suitable type of semiconductor material. As shown, each of the active regions 1020 extend along vertically as continuous regions of material, upon which one or more PMOS and/or NMOS transistors are defined. Transistors are defined on the active regions 1020 in regions intersected by the metal gate structure(s) 1017. As shown, the metal gate structures 1017 extend horizontally and substantially perpendicular to the active regions 1020. Metal material of the gate structures 1017 can be separated from the active regions 1020 by a thin layer of a dielectric material, which in some implementations may be a high-k dielectric material. The gate structures 1017 described herein may therefore include multiple layers, for example, a gate dielectric layer and a gate metal. The gate structures 1017 can be similar to the gate structures 617 of FIG. 6.

The transistors formed using the gate structures 1017 and the active regions 1020 include source/drain region(s). The source/drain regions are shown as coupled to corresponding metal source/drain structures 1016, which may be used to route signals from the source/drain regions of the transistors to other portions of the memory circuit 1000. The metal source/drain structures 1016 can be similar to the metal source/drain structures 616 of FIG. 6. The semiconductor layout 1000 can be coupled to a ground voltage via a backside power delivery technique. The backside power delivery in this example is shown as being provided by the power connections 1014. Although shown as being formed above the active region 1020 for visual clarity, it should be understood that the power connection 1014 to the ground voltage is provided beneath the source/drain node(s) of the corresponding transistor(s) of the memory cells 1002A and 1002B. The power connection 1014 may be provided via a BSC-S technique, in some implementations.

The bit lines BL and BLB (shown as the first bit lines BL[0] and BLB[0] and the second bit lines BL[1] and BLB[1]) are coupled to metal source/drain structures 1016 of the access transistors of the memory cells. The first bit lines BL[0] and BLB[0] are defined as the vertical metal rails 1006A and 1006B. The second bit lines BL[1] and BLB[1] are defined as the vertical metal rails 1006C and 1006D. Power can be supplied (e.g., a supply voltage) to the first and second memory cells using the vertical metal rails 1004.

As shown, the word lines WLa, WLb, WLc, and WLd are defined by four metal rails 1005A, 1005B, 1005C, and 1005D (sometimes referred to as the "metal rail(s) 1005"), which extend substantially parallel to the active regions 1020. In some implementations, the metal rails 1005A, 1005B, 1005C, and 1005D can be defined as part of one or more metal layers that also define the metal rails 1004 and 1006A-1006D. The metal rails 1005A, 1005B, 1005C, and 1005D can be coupled to the gate terminals of the memory cells using corresponding word line via connections 1018, which may be similar to word line via connections 610A, 610B, 612A, and 612B of FIG. 6. The metal rails 1005A and 1005B and the word line via connections 1018 can include but are not limited to aluminum, tungsten, tungsten nitride, copper, cobalt, silver, gold, chrome, ruthenium, platinum, titanium, titanium nitride, tantalum, tantalum nitride, nickel, hafnium, alloys, and combinations thereof.

As shown, the word line via connections 1018 are coupled to the gate structures 1017 of the access transistors through a layer of metal material beneath the metal rails 1005A, 1005B, 1005C, and 1005D. Similarly, the metal source/drain structures 1016 are coupled to other metal layers of the memory circuit 1000 via the source/drain-to-metal via connections 1022. The source/drain-to-metal via connections 1022 can be any type of metal structure with a conductive via. The source/drain-to-metal via connections 1022 can include but is not limited to aluminum, tungsten, tungsten nitride, copper, cobalt, silver, gold, chrome, ruthenium, platinum, titanium, titanium nitride, tantalum, tantalum nitride, nickel, hafnium, alloys, and combinations thereof.

As shown, in this example the layout of the memory cell 1002A is a mirrored layout of the adjacent memory cell 1002B, and the layout of the memory cell 1002C is a mirrored layout of the adjacent memory cell 1002D (matching the layout of the memory cells 1002A and 1002B). This layout provides a common bit line arrangement, in which the bit lines BL[0] and BLB[0] are shared by the memory cells 1002A and 1002B, and the bit lines BL[1] and BLB[1] are shared by the memory cells 1002C and 1002D. In some implementations, additional metal layers can be provided above the word lines 1005A, 1005B, 1005C, and 1005D to provide further connections to other memory cells in the same row of the memory array.

Figure 11:
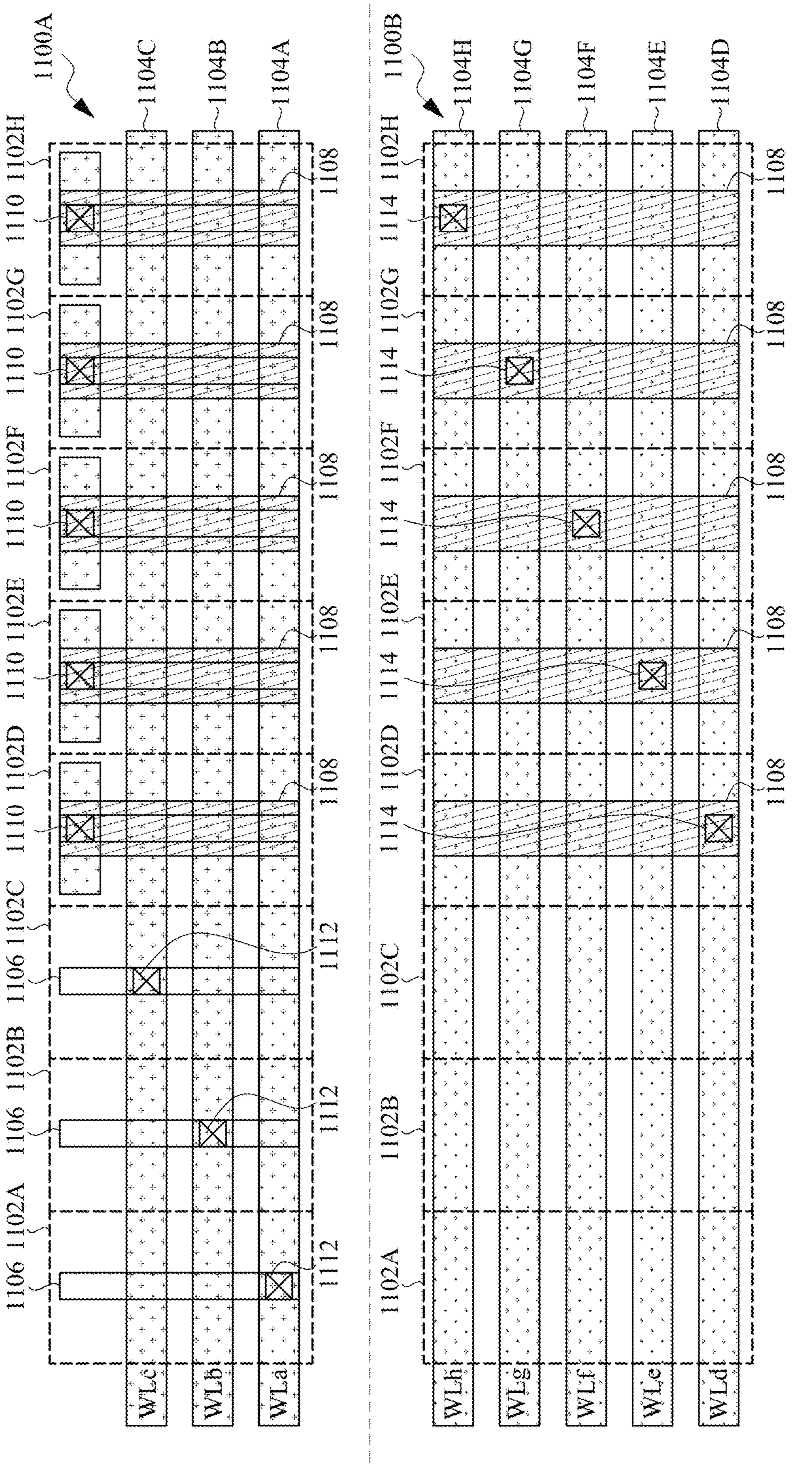
FIG. 11 illustrates a block diagram showing example word line connections for a semiconductor layout of an expanded circuit similar to the memory circuit shown in FIG. 9, in accordance with some embodiments.

Referring to FIG. 11, illustrated are block diagrams 1100A and 1100B showing example word line connections for a semiconductor layout of an expanded circuit similar to the memory circuit shown in FIG. 9, in accordance with some embodiments. The example metal rails provided for the word line connections can be provided for eight memory cells that are respectively defined in a semiconductor substrate within layout regions 1102A, 1102B, 1102C, 1102D, 1102E, 1102F, 1102G, and 1102H. The word line connections provided via a corresponding set of metal rails 1104A, 1104B, 1104C, 1104D, 1104E, 1104F, 1104G, and 1104H. The metal rails 1104A, 1104B, and 1104C are provided as part of a first metal layer, which also defines metal regions parallel to the metal rails 1104A, 1104B, and 1104C that in the layout regions 1102D, 1102E, 1102F, 1102G, and 1102H.

As shown, the metal rails 1104A, 1104B, and 1104C are coupled to corresponding word lines 1106, which extend perpendicular to and beneath the metal rails 1104A, 1104B, and 1104C. In this example, the word lines 1106 can extend vertically, similar to the arrangement described in connection with FIG. 10. The metal rails 1104A, 1104B, and 1104C are coupled to the word lines 1106 using a first set of conductive vias 1112, which may be similar to other conductive vias described herein. For example, any of the metal rails, metal layers, and/or conductive vias described in connection with FIG. 11 can include but are not limited to aluminum, tungsten, tungsten nitride, copper, cobalt, silver, gold, chrome, ruthenium, platinum, titanium, titanium nitride, tantalum, tantalum nitride, nickel, hafnium, alloys, and combinations thereof.

To provide connections to upper metal layers, regions of a second metal layer 1108 are provided that extend perpendicular to the metal rails 1104A, 1104B, and 1104C and the regions of the first metal layer. The regions of the second metal layer 1108 are shown as including a second set of conductive vias 1110, which can be similar to the first conductive vias 1112. The second metal layer 1108 can be formed on top of the first metal layer including the metal rails 1104A, 1104B, and 1104C and can be electrically coupled to the first metal layer at the second set of conductive vias 1110.

As shown, the second set of conductive vias 1110 are provided for each of the memory cells corresponding to the layout regions 1102D, 1102E, 1102F, 1102G, and 1102H. Additionally, beneath each of the second set of conductive vias 1110, an additional conductive via 1112 electrically couples the upper regions of the first metal layer to corresponding word lines 1106 that extend beneath the first metal layer, which are parallel to the word lines 1106 in the layout regions 1102A, 1102B, and 1102C. The regions of the second metal layer 1108 are therefore electrically coupled to the word lines 1106 for the memory devices corresponding to the layout regions 1102D, 1102E, 1102F, 1102G, and 1104H.

The block diagram 1100B is shown as including a third metal layer defining metal rails 1104D, 1104E, 1104F, 1104G, and 1104H each corresponding to the word lines for the memory cells within the layout regions 1102D, 1102E, 1102F, 1102G, and 1102H. The third metal layer is formed above the second metal layer. The metal rails 1104D, 1104E, 1104F, 1104G, and 1104H of the third metal layer are each shown as including a corresponding conductive via 1114, which extends downward and electrically couples the metal rails 1104D, 1104E, 1104F, 1104G, and 1104H to a corresponding region of the second metal layer 1108. The metal rails 1104D, 1104E, 1104F, 1104G, and 1104H of the third metal layer are therefore electrically coupled to the word lines 1106 for the memory devices corresponding to the layout regions 1102D, 1102E, 1102F, 1102G, and 1104H.

Figure 12:
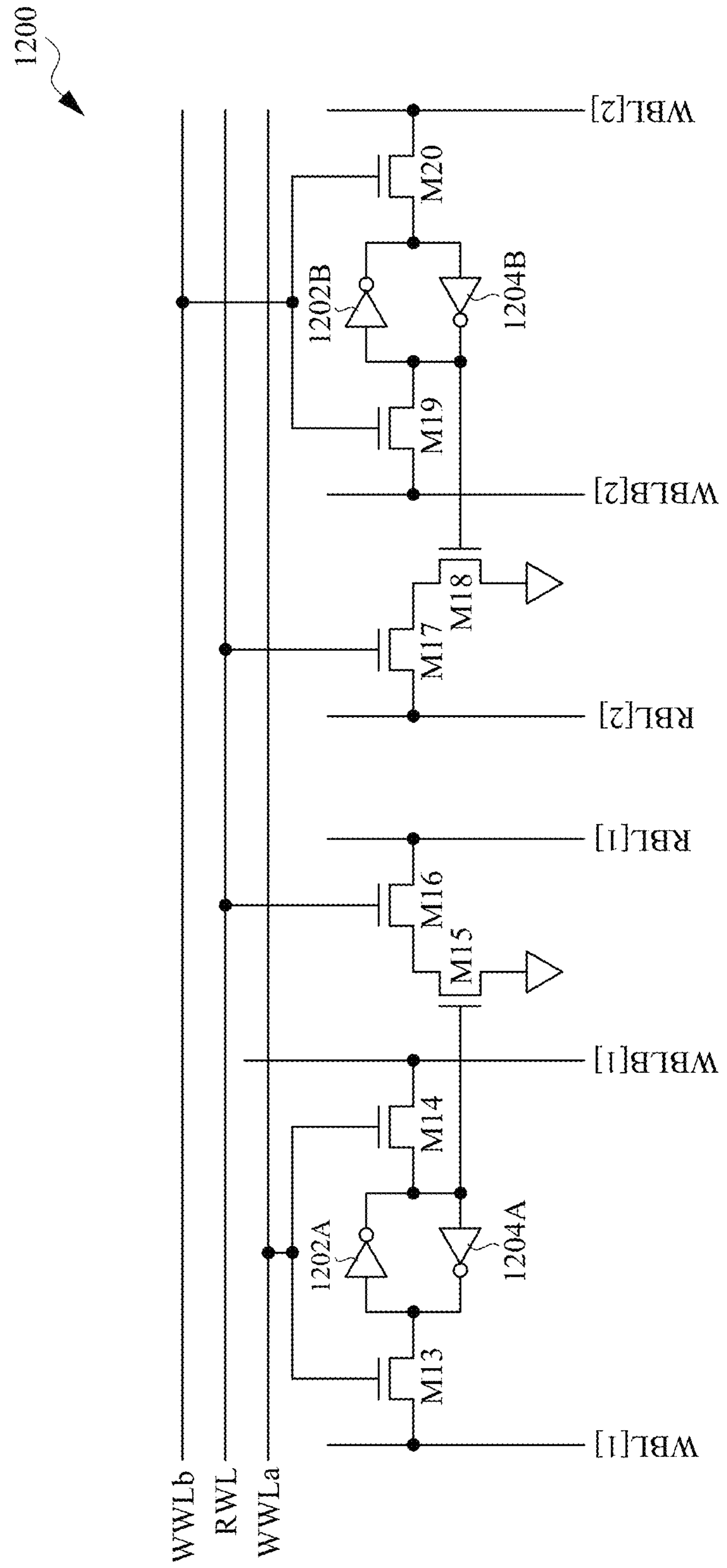
FIG. 12 illustrates a diagram of an example memory circuit including multiport memory cells with interleaved word lines, in accordance with some embodiments.

Referring to FIG. 12, illustrated is a diagram of an example memory circuit 1200 including multiport memory cells with interleaved word lines, in accordance with some embodiments. The dual port memory cells in this example share a read word line RWL and include interleaved write word lines WWLa and WWLb, as shown. A first memory cell includes the cross-coupled inverters 1202A and 1204A and a second memory cell includes the cross-coupled inverters 1202B and 1204B. The memory circuit 1200 is shown as including the transistors M13, M14, M15, M16, M17, M18, M19, and M20. Although each of the transistors M13-M20 of the memory circuit 1200 are shown as one transistor, embodiments are not limited thereto. For example, each of the transistors may include multiple transistors ("sub-transistor(s)") that are connected to one another in parallel. For example, in an embodiment, each of the sub-transistors of any transistor described herein can include respective gate, drain, and source terminals, each of which may be connected to one another in parallel.

In some implementations, the transistors M13, M14, M15, M16, M17, M18, M19, and M20 are nMOSFET transistors. It is appreciated that each of the transistors M13-M20 can include any of various other types of transistors (e.g., bipolar junction transistors, high-electron-mobility transistors, etc.) while remaining within the scope of the present disclosure. The first memory cell includes the transistors M13, M14, M15, and M16, and the second memory cell includes the transistors M17, M18, M19, and M20. A first source/drain terminal of the transistors M13 and M20 is coupled to the write bit lines WBL[1] and WBL[2] of the first and second memory cells, respectively. A second source/drain terminal of the transistors M13 and M20 is coupled to a first node of the cross coupled inverters of the first and second memory cells, respectively. A first source/drain terminal of the transistors M14 and M19 is coupled to the reference write bit lines WBLB[1] and WBLB[2] of the first and second memory cells, respectively. A second source/drain terminal of the transistors M14 and M19 is coupled to a second node of the cross coupled inverters of the first and second memory cells, respectively.

A gate terminal of the transistors M16 and M17 is coupled to the shared read word line RWL. A first source/drain terminal of the transistors M16 and M17 is coupled to the read bit lines RBL[1] and RBL[2] of the first and second memory cells, respectively. A second source/drain terminal of the transistors M16 and M17 is coupled to a first source/drain terminal of the transistors M15 and M18, respectively. A second source/drain terminal of the transistors M15 and M18 is coupled to a ground voltage. Gate terminal of the transistors M15 and M18 are coupled to the second node of the cross-coupled inverters of the first and second memory cells.

In this example, the memory cells of the memory circuit 1200 are included in the same row and are coupled to two write word lines WLa and WLb and a shared read word line RWL. The gate terminals of the transistors M13 and M14 are coupled to the first write word line WLa. The gate terminals of the transistors M19 and M20 are coupled to the second write word line WLb. The gate terminals of the transistors M16 and M17 are coupled to the shared read word line RWL.

The transistors M13, M14, M19, and M19 act as access transistors for write operations for the memory cells of the memory circuit 1200, similar to the circuit described in connection with FIG. 5. The transistors M16 and M17 act as access transistors for read operations for the memory cells of the memory circuit 1200. In one example, when the shared read word line RWL is in a logic high state, the transistors M16 and M17 turn on and conduct. If the voltage at the second node of cross-coupled inverters of the first memory cell is in a logic high state, the transistor M15 turns on and conducts. If the voltage at the second node of cross-coupled inverters of the second memory cell is in a logic high state, the transistors M18 turns on and conducts. If both the transistors M15 and M16 are turned on, the read bit line RBL[1] begins to discharge to the ground voltage. If both the transistors M17 and M18 are turned on, the read bit line RBL[2] begins to discharge to the ground voltage.

Figure 13:
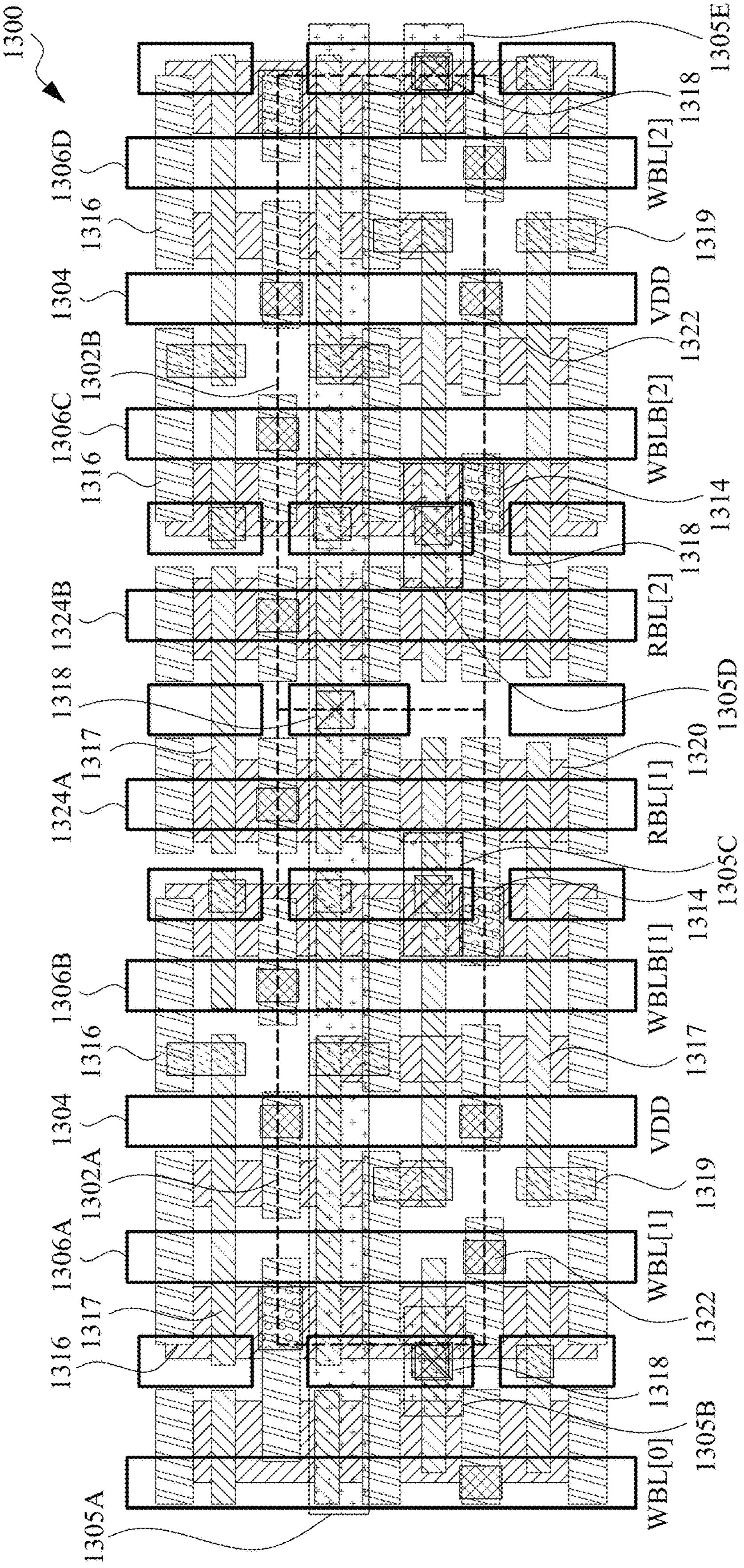
FIG. 13 illustrates a block diagram showing an example semiconductor layout of the memory circuit shown in FIG. 12, in accordance with some embodiments.

Referring to FIG. 13 in the context of the components described in connection with FIG. 12 illustrated is a block diagram showing an example semiconductor layout 1300 of the memory circuit shown in FIG. 12, in accordance with some embodiments. The layout of FIG. 13 is similar to the layouts shown in FIGS. 6 and 10. For ease of visualization, like patterns in FIG. 13 correspond to like material structures, and some reference numbers have been omitted in the interest of visual clarity of the semiconductor layout. The example layout 1300 is a top-down layout showing multiple active regions 1320, which in this example extend vertically. In the example shown in FIG. 13, two memory cells 1302A and 1302B are shown (sometimes referred to as the "memory cell(s) 1302"), which can correspond to the first and second memory cells shown in the memory circuit 1200 of FIG. 12. Each memory cell 1302 can include four vertical active regions 1320, as shown.

The active regions 1320 can be similar to the active regions 620 of FIG. 6, and may include any suitable type of semiconductor material. As shown, each of the active regions 1320 extend along vertically as continuous regions of material, upon which one or more PMOS and/or NMOS transistors are defined. Transistors are defined on the active regions 1320 in regions intersected by the metal gate structure(s) 1317. As shown, the metal gate structures 1317 extend horizontally and substantially perpendicular to the active regions 1320. Metal material of the gate structures 1317 can be separated from the active regions 1320 by a thin layer of a dielectric material, which in some implementations may be a high-k dielectric material. The gate structures 1317 described herein may therefore include multiple layers, for example, a gate dielectric layer and a gate metal. The gate structures 1317 can be similar to the gate structures 617 of FIG. 6.

The transistors formed using the gate structures 1317 and the active regions 1320 include source/drain region(s). The source/drain regions are shown as coupled to corresponding metal source/drain structures 1316, which may be used to route signals from the source/drain regions of the transistors to other portions of the layout 1300. The metal source/drain structures 1316 can be similar to the metal source/drain structures 1016 of FIG. 10. The semiconductor layout 1300 can be coupled to a ground voltage via a backside power delivery technique. The backside power delivery in this example is shown as being provided by the power connections 1314. Although shown as being formed above the active region 1320 for visual clarity, it should be understood that the power connection 1314 to the ground voltage is provided beneath the source/drain node(s) of the corresponding transistor(s) of the memory cells 1302A and 1302B. The power connection 1314 may be provided via a BSC-S technique, in some implementations.

The write bit lines WBL and WBLB (shown as the first write bit lines WBL[1] and WBLB[1] and the second write bit lines WBL[2] and WBLB[2]) are coupled to metal source/drain structures 1316 of the write access transistors of the memory cells. The first write bit lines WBL[1] and WBLB[1] are defined as the vertical metal rails 1306A and 1306C. The second write bit lines WBL[2] and WBLB[2] are defined as the vertical metal rails 1306B and 1306D. The read bit lines RBL[1] and RBL[2] for the first and second memory cells 1302A and 1302B are coupled to metal source/drain structures 1316 of the read access transistors of the memory cells. The first read bit line RBL[1] is defined as the metal rail 1324A and the second read bit line RBL[2] is defined as the metal rail 1324B. Power can be supplied (e.g., a supply voltage) to the first and second memory cells using the vertical metal rails 1304.

The shared read word line is provided via the metal rail 1305A. The first write word line WWLa for the first memory cell 1302A is provided by the metal regions 1305B and 1305C. The second write word line WWLb for the second memory cell 1302B is provided by the metal rails 1305D and 1305E. The metal rails 1305A, 1305B, 1305C, 1305D, and 1305E can be formed from a same metal layer, and can be coupled to the gate terminals of the memory cells using corresponding word line via connections 1318 (sometimes referred to as gate-to-metal via connections or metal-to gate via connections), which may be similar to word line via connections 610A, 610B, 612A, and 612B of FIG. 6. The metal rails 1305A, 1305B, 1305C, 1305D, and 1305E and the word line via connections 1318 can be formed above the metal layers defining the word bit lines, the read bit lines, and the supply voltage power rails, as shown. The metal rails 1305A, 1305B, 1305C, 1305D, and 1305E can include but are not limited to aluminum, tungsten, tungsten nitride, copper, cobalt, silver, gold, chrome, ruthenium, platinum, titanium, titanium nitride, tantalum, tantalum nitride, nickel, hafnium, alloys, and combinations thereof.

In this example, the read word line RWL and the write word lines WWLa and WWLb extend substantially perpendicular to the active regions 1320. As shown, the gate-to metal via connections 1319 are coupled to the gate structures 1317 of the read and write access transistors through a layer of metal material beneath the metal rails 1305A, 1305B, 1305C, 1305D, and 1305E. This layer of metal material may be formed as part of the same metal layer as the bit lines and supply voltage rails of the semiconductor device and are coupled to the corresponding word lines using the word line via connections 1318. The layers of metal can be coupled to corresponding gate structures 1317 of the memory cells 1302A and 1302B using corresponding gate-to-metal via connections 1319. Similarly, the metal source/drain structures 1316 are coupled to other metal layers of the layout 1300 via the source/drain-to-metal via connections 1322. The source/drain-to-metal via connections 1322 can be any type of metal structure with a conductive via. The source/drain-to-metal via connections 1322 can include but is not limited to aluminum, tungsten, tungsten nitride, copper, cobalt, silver, gold, chrome, ruthenium, platinum, titanium, titanium nitride, tantalum, tantalum nitride, nickel, hafnium, alloys, and combinations thereof.

As shown, in this example the layout of the memory cell 1302A is a mirrored layout of the adjacent memory cell 1302B, centered on the word line conductive via 1318 of the shared read word line. In some implementations, additional metal layers can be provided above the metal rails 1305A, 1305B, 1305C, 1305D, and 1305E to provide further connections to other memory cells in the same row of the memory array. Examples of an alternative layout for metal rails connected to the shared read word line and the write word lines is described in connection with FIG. 14.

Figure 14:
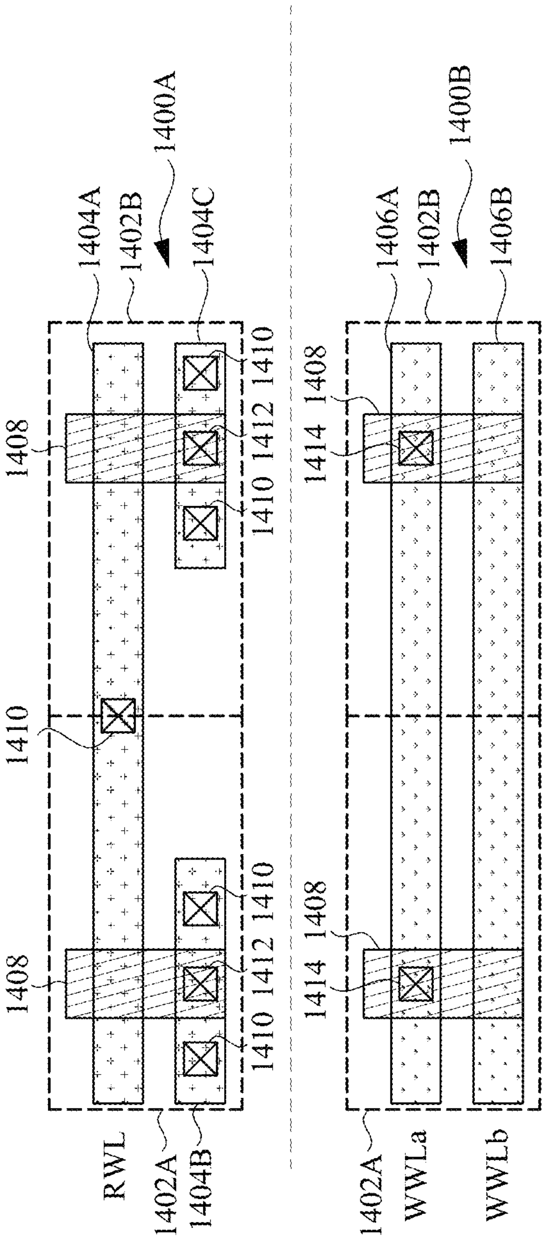
FIG. 14 illustrates a block diagram showing example word line connections for an alternative semiconductor layout of the memory circuit shown in FIG. 12, in accordance with some embodiments.

Referring to FIG. 14, illustrated are block diagrams 1400A and 1400B showing example word line connections for an alternative semiconductor layout of the memory circuit shown in FIG. 12, in accordance with some embodiments. The example metal rails provided for the word line connections can be provided for two memory cells (e.g., the two memory cells 1302A and 1302B) that are respectively defined in a semiconductor substrate within layout regions 1402A and 1402B. The first block diagram 1400A shows a first set of metal rails 1404A, 1404B, and 1404C. The metal rail 1404A can be similar to the metal rail 1305A and corresponds to a shared read word line RWL and includes a conductive via 1410 to a gate of a read access transistor (or a metal layer coupled thereto). The second and third metal rails 1404B and 1404C provide connections between the metal rails 1406A and 1406B defining the write word lines WWLa and WWLb, as shown. The second and third metal rails 1404B and 1404C provide connections to the write access transistors of the first and second memory cells 1302A and 1302B using the conductive vias 1410, similar to the arrangement shown in FIG. 13.

To provide connections to upper metal layers, regions of a second metal layer 1408 are provided that extend perpendicular to the metal rails 1404A, 1404B, and 1404C. The regions of the second metal layer 1408 are shown as including a second set of conductive vias 1412, which can be similar to the first conductive vias 1410. The second metal layer 1408 can be formed on top of the first metal layer including the metal rails 1404A, 1404B, and 1404C and can be electrically coupled to the first metal layer at the second set of conductive vias 1412. The second metal layer is coupled to upper metal layers of the layout for further routing.

The block diagram 1400B is shown as including a third metal layer defining metal rails 1406A and 1406B, each corresponding to the write word lines WWLa and WWLb for the memory cells within the layout regions 1402A and 1402B. The third metal layer is formed above the second metal layer. The metal rails 1406A and 1406B of the third metal layer are each shown as including a corresponding conductive via 1414, which extends downward and electrically couples the metal rails 1406A and 1406B to a corresponding region of the second metal layer 1408. The metal rails 1406A and 1406B of the third metal layer are therefore electrically coupled to the metal rails 1404B and 1404C, respectively, for the memory devices corresponding to the layout regions 1402A and 1402B.

Figure 15:
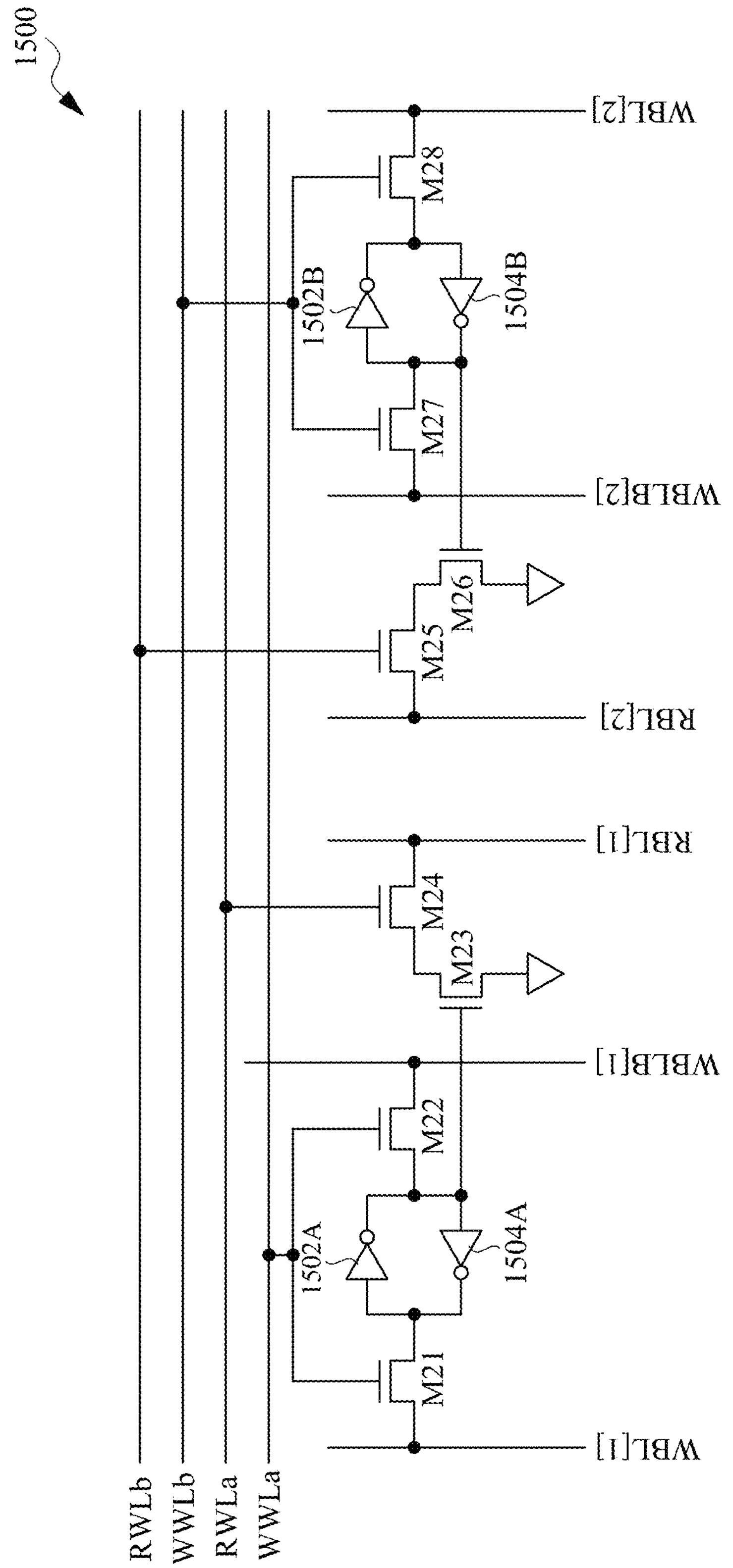
FIG. 15 illustrates a diagram of an example memory circuit including multiport memory cells with interleaved word lines and read lines, in accordance with some embodiments.

Referring to FIG. 15, illustrated is a diagram of an example memory circuit 1500 including multiport memory cells with interleaved write word lines WWLa and WWLb and read word lines RWLa and RWLb, in accordance with some embodiments. A first memory cell includes the cross-coupled inverters 1502A and 1504A and a second memory cell includes the cross-coupled inverters 1502B and 1504B. The memory circuit 1500 is shown as including the transistors M21, M22, M23, M24, M25, M26, M27, and M28. Although each of the transistors M21-M28 of the memory circuit 1500 are shown as one transistor, embodiments are not limited thereto. For example, each of the transistors may include multiple transistors ("sub-transistor(s)") that are connected to one another in parallel. For example, in an embodiment, each of the sub-transistors of any transistor described herein can include respective gate, drain, and source terminals, each of which may be connected to one another in parallel.

In some implementations, the transistors M21, M22, M23, M24, M25, M26, M27, and M28 are nMOSFET transistors. It is appreciated that each of the transistors M21-M28 can include any of various other types of transistors (e.g., bipolar junction transistors, high-electron-mobility transistors, etc.) while remaining within the scope of the present disclosure. The first memory cell includes the transistors M21, M22, M23, and M24, and the second memory cell includes the transistors M25, M26, M27, and M28. A first source/drain terminal of the transistors M21 and M28 is coupled to the write bit lines WBL[1] and WBL[2] of the first and second memory cells, respectively. A second source/drain terminal of the transistors M21 and M28 is coupled to a first node of the cross coupled inverters of the first and second memory cells, respectively. A first source/drain terminal of the transistors M22 and M27 is coupled to the reference write bit lines WBLB[1] and WBLB[2] of the first and second memory cells, respectively. A second source/drain terminal of the transistors M22 and M27 is coupled to a second node of the cross coupled inverters of the first and second memory cells, respectively.

A gate terminal of the transistors M24 and M25 is coupled to the read word lines RWLa and RWLb, respectively. A first source/drain terminal of the transistors M24 and M25 is coupled to the read bit lines RBL[1] and RBL[2] of the first and second memory cells, respectively. A second source/drain terminal of the transistors M24 and M25 is coupled to a first source/drain terminal of the transistors M23 and M26, respectively. A second source/drain terminal of the transistors M23 and M26 is coupled to a ground voltage. Gate terminal of the transistors M23 and M26 are coupled to the second node of the cross-coupled inverters of the first and second memory cells.

In this example, the memory cells of the memory circuit 1500 are included in the same row and are coupled to two write word lines WWLa and WWLb and two read word lines RWLa and RWLb. The gate terminals of the transistors M21 and M22 are coupled to the first write word line WWLa. The gate terminals of the transistors M27 and M28 are coupled to the second write word line WWLb. The gate terminals of the read access transistor M24 is coupled to the first read word line RWLa and the gate terminal of the read access transistor M25 is coupled to the second read word line RWLb.

The transistors M21, M22, M27, and M28 act as access transistors for write operations for the memory cells of the memory circuit 1500, similar to the circuit described in connection with FIG. 5. The transistors M24 and M25 act as access transistors for read operations for the memory cells of the memory circuit 1500, similar to the read access transistors of the circuit described in connection with the FIG. 12. If the voltage at the second node of cross-coupled inverters of the first memory cell is in a logic high state, the transistor M23 turns on and conducts. If the voltage at the second node of cross-coupled inverters of the second memory cell is in a logic high state, the transistors M26 turns on and conducts. If both the transistors M23 and M24 are turned on (with M24 turned on by the read word line RWLa), the read bit line RBL[1] begins to discharge to the ground voltage. If both the transistors M25 and M26 are turned on (with M25 turned on by the read word line RWLb), the read bit line RBL[2] begins to discharge to the ground voltage.

Figure 16:
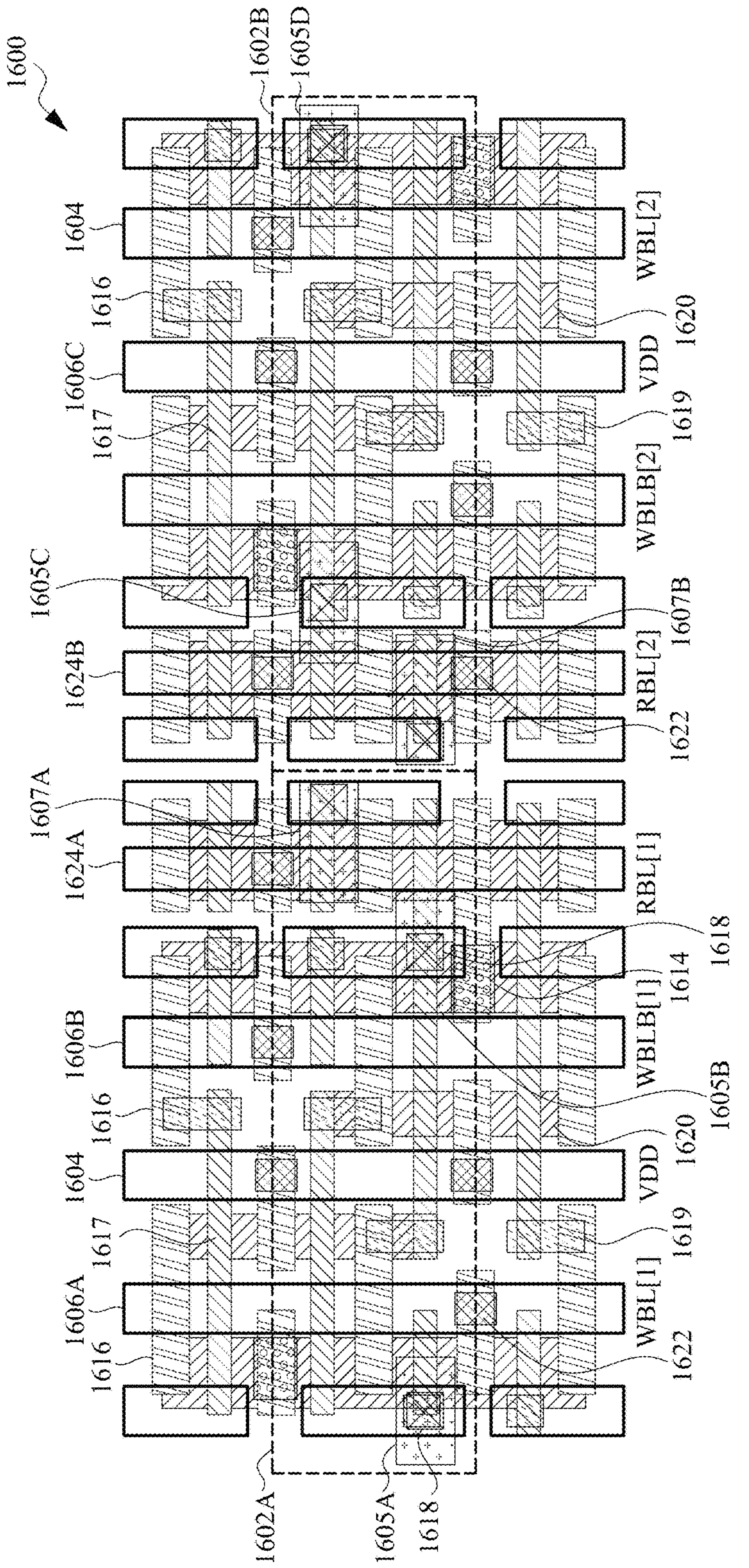
FIG. 16 illustrates a block diagram showing an example semiconductor layout of the memory circuit shown in FIG. 15, in accordance with some embodiments.

Referring to FIG. 16 in the context of the components described in connection with FIG. 15, illustrated is a block diagram 1600 showing an example semiconductor layout of the memory circuit shown in FIG. 15, in accordance with some embodiments. The layout of FIG. 16 is similar to the layouts shown in FIGS. 6, 10, and 13. For ease of visualization, like patterns in FIG. 16 correspond to like material structures, and some reference numbers have been omitted in the interest of visual clarity of the semiconductor layout. The example layout 1600 is a top-down layout showing multiple active regions 1620, which in this example extend vertically. In the example shown in FIG. 16, two memory cells 1602A and 1602B are shown (sometimes referred to as the "memory cell(s) 1602"), which can correspond to the first and second memory cells shown in the memory circuit 1500 of FIG. 15. Each memory cell 1602 can include five vertical active regions 1620, as shown.

The active regions 1620 can be similar to the active regions 620 of FIG. 6, and may include any suitable type of semiconductor material. As shown, each of the active regions 1620 extend along vertically as continuous regions of material, upon which one or more PMOS and/or NMOS transistors are defined. Transistors are defined on the active regions 1620 in regions intersected by the metal gate structure(s) 1617. As shown, the metal gate structures 1617 extend horizontally and substantially perpendicular to the active regions 1620. Metal material of the gate structures 1617 can be separated from the active regions 1620 by a thin layer of a dielectric material, which in some implementations may be a high-k dielectric material. The gate structures 1617 described herein may therefore include multiple layers, for example, a gate dielectric layer and a gate metal. The gate structures 1617 can be similar to the gate structures 617 of FIG. 6.

The transistors formed using the gate structures 1617 and the active regions 1620 include source/drain region(s). The source/drain regions are shown as coupled to corresponding metal source/drain structures 1616, which may be used to route signals from the source/drain regions of the transistors to other portions of the layout 1600. The metal source/drain structures 1616 can be similar to the metal source/drain structures 1616 of FIG. 16. The semiconductor layout 1600 can be coupled to a ground voltage via a backside power delivery technique. The backside power delivery in this example is shown as being provided by the power connections 1614. Although shown as being formed above the active region 1620 for visual clarity, it should be understood that the power connection 1614 to the ground voltage is provided beneath the source/drain node(s) of the corresponding transistor(s) of the memory cells 1602A and 1602B. The power connection 1614 may be provided via a BSC-S technique, in some implementations.

The write bit lines WBL and WBLB (shown as the first write bit lines WBL[1] and WBLB[1] and the second write bit lines WBL[2] and WBLB[2]) are coupled to metal source/drain structures 1616 of the write access transistors of the memory cells. The first write bit lines WBL[1] and WBLB[1] are defined as the vertical metal rails 1606A and 1606B, respectively. The second write bit lines WBL[2] and WBLB[2] are defined as the vertical metal rails 1606D and 1606C, respectively. The read bit lines RBL[1] and RBL[2] for the first and second memory cells 1602A and 1602B are coupled to metal source/drain structures 1616 of the read access transistors of the memory cells. The first read bit line RBL[1] is defined as the metal rail 1624A and the second read bit line RBL[2] is defined as the metal rail 1624B. Power can be supplied (e.g., a supply voltage) to the first and second memory cells using the vertical metal rails 1604.

The read word lines RWLa and RWLb for the first and second memory cells 1602A and 1602B are provided via the metal rails 1607A and 1607B, respectively. The first write word line WWLa for the first memory cell 1602A is provided by the metal regions 1605A and 1605B. The second write word line WWLb for the second memory cell 1602B is provided by the metal regions 1605C and 1605D. The metal rails 1605A, 1605B, 1605C, 1605D, 1607A and 1607B can be formed from a same metal layer, and can be coupled to the gate terminals of the memory cells using corresponding word line via connections 1618, which may be similar to word line via connections 610A, 610B, 612A, and 612B of FIG. 6. The metal rails 1605A, 1605B, 1605C, 1605D, 1607A and 1607B and the word line via connections 1618 can be formed above the metal layers defining the word bit lines, the read bit lines, and the supply voltage power rails, as shown. The metal rails 1605A, 1605B, 1605C, 1605D, 1607A and 1607B and the metal via connections 1618 can include but are not limited to aluminum, tungsten, tungsten nitride, copper, cobalt, silver, gold, chrome, ruthenium, platinum, titanium, titanium nitride, tantalum, tantalum nitride, nickel, hafnium, alloys, and combinations thereof.

In this example, the read word lines RWLa and RWLb and the write word lines WWLa and WWLb extend substantially perpendicular to the active regions 1620. As shown, the gate-to metal via connections 1619 are coupled to the gate structures 1617 of the read and write access transistors through a layer of metal material beneath the metal rails 1605A, 1605B, 1605C, 1605D, 1607A and 1607B. This layer of metal material may be formed as part of the same metal layer as the bit lines and supply voltage rails of the semiconductor device and are coupled to the corresponding word lines using the word line via connections 1618. The layers of metal can be coupled to corresponding gate structures 1617 of the memory cells 1602A and 1602B using corresponding gate-to-metal via connections 1619. Similarly, the metal source/drain structures 1616 are coupled to other metal layers of the layout 1600 via the source/drain-to-metal via connections 1622. The source/drain-to-metal via connections 1622 can be any type of metal structure with a conductive via. The source/drain-to-metal via connections 1622 can include but are not limited to aluminum, tungsten, tungsten nitride, copper, cobalt, silver, gold, chrome, ruthenium, platinum, titanium, titanium nitride, tantalum, tantalum nitride, nickel, hafnium, alloys, and combinations thereof.

As shown, in this example the layout of the memory cell 1602A is a mirrored layout of the adjacent memory cell 1602B along two axes. In some implementations, additional metal layers can be provided above the metal rails 1605A, 1605B, 1605C, 1605D, 1607A and 1607B to provide further connections to other memory cells in the same row of the memory array. Examples of an alternative layout for metal rails connected to the read word lines and the write word lines is described in connection with FIG. 17.

Figure 17:
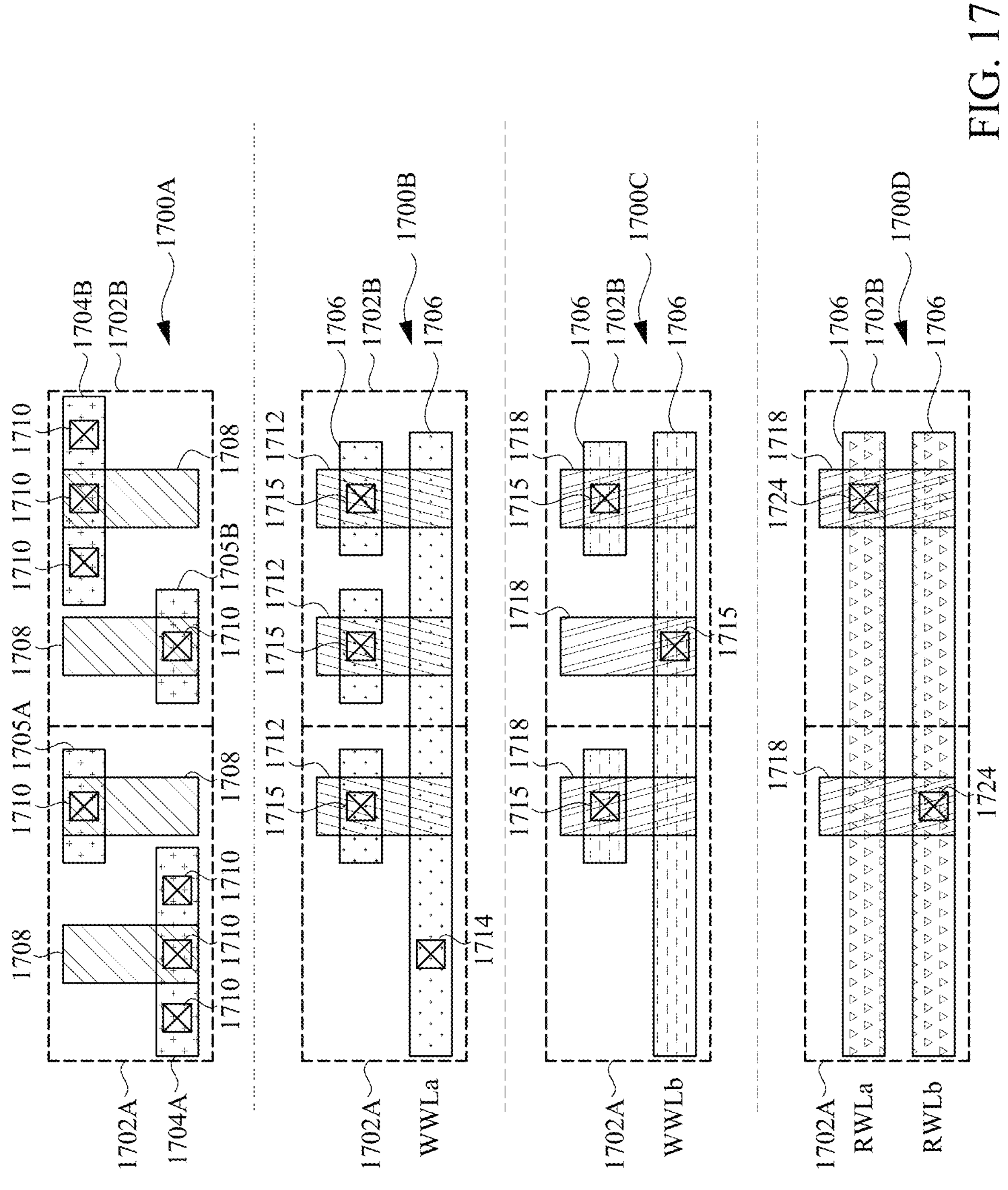
FIG. 17 illustrates a block diagram showing example word line connections for the semiconductor layout shown in FIG. 16, in accordance with some embodiments.

Referring to FIG. 17 in the context of the components described in connection with FIG. 16, illustrated are block diagram 1700A, 1700B, 1700C, and 1700D showing example word line connections for the semiconductor layout shown in FIG. 16, in accordance with some embodiments. The example metal rails provided for the word line connections can be provided for two memory cells (e.g., the two memory cells 1602A and 1602B) that are respectively defined in a semiconductor substrate within layout regions 1702A and 1702B. The first block diagram 1700A shows a first set of metal rails 1704A, 1704B, 1705A, and 1705B, which may be formed as part of a first metal layer. The metal rails 1705A and 1705B can be similar to the metal rails 1607A and 1607B and correspond to the read word lines RWLa and RWLb and includes conductive vias 1710 to the gates of the read access transistors (or a metal layer coupled thereto). The metal rails 1704A and 1704B provide connections between other metal rails of upper layers defining the write word lines WWLa and WWLb, as described in further detail herein. The metal rails 1704A and 1704B provide connections to the write access transistors of the first and second memory cells 1602A and 1602B using the conductive vias 1710, similar to the arrangement shown in FIG. 16.

To provide connections to upper metal layers, regions of a second metal layer 1708 are provided that extend perpendicular to the metal rails 1704A, 1704B, 1705A, and 1705B. The regions of the second metal layer 1708 are shown as including a second set of conductive vias 1710, coupling the regions of the second metal layer 1708 to corresponding metal rails 1704A, 1704B, 1705A, and 1705B of the first metal layer. The second metal layer 1708 can be formed on top of the first metal layer including the metal rails 1704A, 1704B, 1705A, and 1705B and can be electrically coupled to the first metal layer at the second set of conductive vias 1710. The second metal layer 1708 is coupled to upper metal layers of the layout for further routing.

The block diagram 1700B is shown as including a third metal layer 1706 defining a metal rail corresponding to the first write word line WWLa, and corresponding metal regions providing connections from upper word lines (e.g., the second write word line WWLb, the first read word line RWLa, the second read word line RWLb) to the second metal layer 1708. The corresponding metal regions are provided for each of the memory cells within the layout regions 1702A and 1702B. The third metal layer is formed above the second metal layer. The metal rail of the third metal layer is shown as including a conductive via 1714, which extends downward and electrically couples the metal rail to a corresponding region of the second metal layer 1708. Each of the metal regions of the second metal layer 1708 include a similar connective via to connect the metal regions of the third metal layer 1706 to corresponding regions of the second metal layer 1708. The metal rails and regions of the third metal layer 1706 are therefore electrically coupled to the metal rails 1704A, 1704B, 1705A, and 1705B, respectively, for the memory devices corresponding to the layout regions 1702A and 1702B.

To provide connections to upper metal layers, regions of a fourth metal layer 1712 are provided that extend perpendicular to the metal rails and regions of the third metal layer 1706. The regions of the fourth metal layer 1712 are shown as including a second set of conductive vias 1715, coupling the regions of the fourth metal layer 1712 to corresponding metal regions of the third metal layer 1706. The fourth metal layer 1712 can be formed on top of third metal layer 1706 and can be electrically coupled to the third metal layer at the second set of conductive vias 1715. The fourth metal layer 1712 is coupled to upper metal layers of the layout for further routing.

The block diagram 1700C is shown as including a fifth metal layer 1716 defining a metal rail corresponding to the second write word line WWLb, and corresponding metal regions providing connections from upper word lines (e.g., the first read word line RWLa, the second read word line RWLb) to the fourth metal layer 1706. The corresponding metal regions are provided for each of the memory cells within the layout regions 1702A and 1702B. The fifth metal layer 1716 is formed above the fourth metal layer 1712. The metal rail and metal regions of the fifth metal layer are each shown as including a corresponding conductive via connection 1720, which extends downward and electrically couples the metal rails and metal regions to a corresponding region of the third metal layer 1706. The conductive via connections 1720 also extend upward to electrically couple the metal rails and regions of the fifth metal layer 1716 to regions of a sixth metal layer 1718. The metal rails and regions of the fifth metal layer 1716 are therefore electrically coupled to the metal rails 1704B, 1705A, and 1705B, respectively, for the memory devices corresponding to the layout regions 1702A and 1702B.

To provide connections to upper metal layers, regions of the sixth metal layer 1718 are provided that extend perpendicular to the metal rails and regions of the fifth metal layer 1716. The regions of the sixth metal layer 1718 are shown as being coupled to the fifth metal layer 1716 by the conductive vias 1720, as described above. The sixth metal layer 1718 is coupled to upper metal layers of the layout corresponding to the read word lines RWLa and RWLb.

The block diagram 1700D is shown as including a seventh metal layer 1722 defining two metal rails corresponding to the first read word lines RWLa and the second read word line RWLb. The metal rails of the seventh metal layer 1722 are provided for each of the memory cells within the layout regions 1702A and 1702B. The seventh metal layer 1722 is formed above and extends perpendicular to the sixth metal layer 1718, as shown. The metal rails of the seventh metal layer 1722 are each shown as including a corresponding conductive via connection 1724, which extends downward and electrically couples the metal rails to a corresponding region of the sixth metal layer 1718. The metal rails and regions of the fifth metal layer 1716 are therefore electrically coupled to the metal rails 1705A and 1705B, respectively, for the memory devices corresponding to the layout regions 1702A and 1702B.

Figure 18:
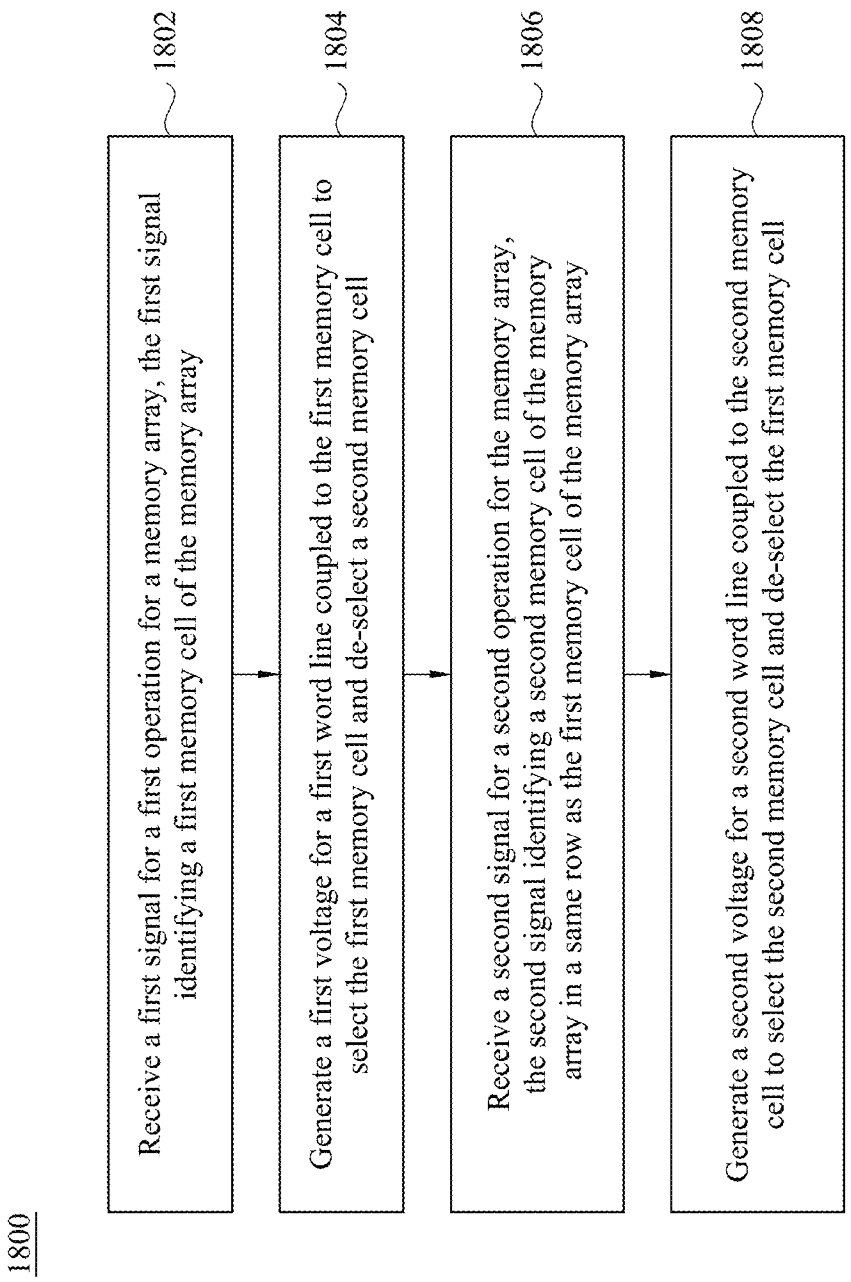
FIG. 18 illustrates a flow chart of an example method to operate the memory systems, devices, and circuits of FIGS. 1-17, in accordance with some embodiments.

Referring to FIG. 18, illustrated is a flow chart of an example method 1800 to operate the memory systems, devices, and circuits of FIGS. 1-17, in accordance with some embodiments. For example, the method 1800 includes operations to perform read and/or write operations for memory cells having interleaved word lines, as described herein. It is noted that the method 1800 is merely an example and is not intended to limit the present disclosure. Accordingly, it is understood that additional operations may be provided before, during, and after the method 1800 of FIG. 18, and that some other operations may only be briefly described herein.

In brief overview, the method 1800 starts with operation 1802 of receiving a signal for a write operation for a memory array that identifies a first memory cell of the memory array. The method 1800 proceeds to operation 1804 of generating a first voltage for a first word line coupled to the first memory cell to select the first memory cell and de-select a second memory cell. The method 1800 proceeds to operation 1806 of receiving a second signal for a second operation for the memory array. The method 1800 proceeds to operation 1808 of generating a second voltage for a second word line coupled to the second memory cell to select the second memory cell and de-select the first memory cell.

The method 1800 starts with operation 1802, in which a signal (e.g., a memory cell address, a write enable signal or a read enable signal, etc.) is received for a memory operation for a memory array (e.g., the memory array shown in FIG. 1) that identifies a first memory cell (e.g., the memory cell 110) of the memory array. The signal may be received from a memory control circuit and may include an address of the first memory cell. The signal may indicate the type of memory operation, and may include a read operation, a write operation, or a combination read/write operation. The signal may indicate one or more banks of the memory array. The row where the first memory cell is located may be in a first memory bank of the memory array.

The method 1800 proceeds with operation 1804, in which a first voltage (e.g., a logic high voltage, etc.) is generated for a first word line (e.g., the word line WLa, the write word line WWLa, the read word line RWLa, etc.) coupled to the first memory cell. Asserting the first word line may include deactivating other word lines for memory cells in the same row. For example, if other memory cells (e.g., in a different column, etc.) in the same row are coupled to other word lines (e.g., second word line WLb, second write word line WWLb, shared read word line RWL, first and second read word lines RWLa and RWLb, etc.), those word lines can be de-asserted in a logic low state. This prevents unintentional dummy reads or read/write disturbances when performing memory operations on the selected memory cell.

The method 1800 proceeds with operation 1806, in which a second signal (e.g., a subsequent memory cell address, a write enable signal or a read enable signal, etc.) is received for a second memory operation for the memory array (e.g., the memory array shown in FIG. 1) that identifies the second memory cell (e.g., the memory cell 110 in a second column 109). The second signal may be received from a memory control circuit and may include an address of the second memory cell. The signal may indicate the type of memory operation, and may include a read operation, a write operation, or a combination read/write operation. The signal may indicate one or more banks of the memory array. The row and memory bank where the second memory cell is located is the same memory bank of the memory array as the first memory cell. In some implementations, the second memory cell is adjacent to the first memory cell.

The method 1800 proceeds with operation 1808, in which a second voltage (e.g., a logic high voltage, etc.) is generated for a second word line (e.g., the word line WLb, the write word line WWLb, the read word line RWLb, etc.) coupled to the second memory cell. Asserting the second word line may include deactivating other word lines for memory cells in the same row. This can include deactivating the first word line coupled to the first memory cell, as well as any other word lines coupled to other memory cells in the same row as the second memory cell. As described above, this prevents unintentional dummy reads or read/write disturbances when performing memory operations on the selected memory cell. The second memory cell is located in the same row as the first memory cell, as described herein. The second memory operation may be the same or may be different from the first memory operation.

Subsequent memory operations may also be performed on other memory cells in the memory array. For example, the memory circuit can receive a third signal (e.g., address and control signals for memory operations) for a third memory operation that identifies a third memory cell in the same row as the first memory cell and the second memory cell. In response to the third signal, the memory circuit can generate a voltage to activate a word line coupled to the third memory cell. In some implementations, the third memory cell is coupled to a third word line, and the memory circuit can generate a third voltage for the third word line coupled to the third memory cell to select the third memory cell and de-select the first memory cell and the second memory cell. In some implementations, the third memory cell is coupled to the first word line, and the memory circuit can generate the first voltage for the first word line coupled to the third memory cell to select the third memory cell and de-select the second memory cell. In such implementations, the second memory cell may be between the first memory cell and the third memory cell in the row of the memory array, as shown in FIG. 1.

In one aspect of the present disclosure, a memory system is disclosed. The memory system includes a first column of memory cells coupled to a first word line. The memory system includes a second column of memory cells coupled to a second word line, wherein a first memory cell of the first column is in a same row as a second memory cell of the second column. The memory system includes a word line driver circuit configured to generate a select signal at the first word line to select the first memory cell and de-select the second memory cell.

In another aspect of the present disclosure, a semiconductor device is disclosed. The semiconductor device includes a first metal rail forming a first word line coupled to a first gate terminal of a first transistor of a first memory cell of a first column of memory cells. The semiconductor device includes a second metal rail forming a second word line coupled to a second gate terminal of a second transistor of a second memory cell of a second column of memory cells, the first memory cell and the second memory cell included in a same row of a memory array.

In yet another aspect of the present disclosure, a method for is disclosed. The method includes receiving, by a memory circuit, a first signal for a first operation for a memory array, the first signal identifying a first memory cell of the memory array. The method includes generating, by the memory circuit, a first voltage for a first word line coupled to the first memory cell to select the first memory cell and de-select a second memory cell. The method includes receiving, by the memory circuit, a second signal for a second operation for the memory array. The second signal identifies the second memory cell in a same row as the first memory cell. The method includes generating, by the memory circuit, a second voltage for a second word line coupled to the second memory cell to select the second memory cell and de-select the first memory cell.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory system, comprising:

a first column of memory cells coupled to a first word line;

a second column of memory cells coupled to a second word line, wherein a first memory cell of the first column is in a same row as a second memory cell of the second column; and a word line driver circuit configured to generate a select signal at the first word line to select the first memory cell and to de-assert the second word line to de-select the second memory cell;

wherein the first column is one of a plurality of first columns of memory cells each coupled to the first word line, wherein the second column is one of a plurality of second columns of memory cells each coupled to the second word line, and wherein the plurality of first columns is interleaved with the plurality of second columns in a memory array.

2. The memory system of claim 1, wherein the first column of memory cells is adjacent to the second column of memory cells.

3. The memory system of claim 1, wherein the first word line is a first write word line and the second word line is a second write word line, and wherein the first column of memory cells is coupled to a first read word line and the second column of memory cells is coupled to a second read word line.

4. The memory system of claim 3, wherein the word line driver circuit is further configured to generate a second select signal at the first read word line to select the first memory cell and de-select the second memory cell for a read operation.

5. The memory system of claim 3, wherein the memory cells of the first column and the second column comprise dual-port memory cells.

6. The memory system of claim 1, wherein each memory cell of the first column is coupled to a first bit line and each memory cell of the second column is coupled to a second bit line.

7. The memory system of claim 6, further comprising:

an amplifier circuit coupled to the first bit line and the second bit line, the amplifier circuit configured to pre-charge the first bit line and the second bit line.

8. The memory system of claim 6, further comprising:

a first amplifier circuit coupled to the first bit line; and a second amplifier circuit coupled to the second bit line.

9. The memory system of claim 1, wherein the first memory cell of the first column and the second memory cell of the second column are coupled to a shared read word line.

10. A semiconductor device, comprising:

a first metal rail forming a first word line coupled to a first gate terminal of a first transistor of a first memory cell of a first column of memory cells; and a second metal rail forming a second word line coupled to a second gate terminal of a second transistor of a second memory cell of a second column of memory cells, the first memory cell and the second memory cell included in a same row of a memory array;

wherein the first memory cell and the second memory cell are coupled to a ground voltage via a backside connection.

11. The semiconductor device of claim 10, wherein the first metal rail is substantially parallel with the second metal rail.

12. The semiconductor device of claim 10, wherein the first metal rail is coupled to the first gate terminal by at least one via connection.

13. The semiconductor device of claim 10, further comprising:

a third memory cell of a third column; and a fourth memory cell of a fourth column, each of the first memory cell, the second memory cell, the third memory cell, and the fourth memory cell included in the same row of the memory array.

14. The semiconductor device of claim 13, wherein the first metal rail is formed as part of a first metal layer and the second metal rail is formed as part of a second layer above the first metal layer, the first metal layer coupled to the second layer using at least one via connection.

15. A method, comprising:

receiving, by a memory circuit, a first signal for a first operation for a memory array, the first signal identifying a first memory cell of the memory array;

generating, by the memory circuit, a first voltage for a first word line coupled to the first memory cell to select the first memory cell and de-asserting a second word line to de-select a second memory cell;

receiving, by the memory circuit, a second signal for a second operation for the memory array, the second signal identifying the second memory cell in a same row as the first memory cell; and generating, by the memory circuit, a second voltage for the second word line coupled to the second memory cell to select the second memory cell, and de-asserting the first word line to de-select the first memory cell;

wherein the first memory cell is in one of a plurality of first columns of memory cells each coupled to the first word line, wherein the second memory cell is in one of a plurality of second columns of memory cells each coupled to the second word line, and wherein the plurality of first columns is interleaved with the plurality of second columns in the memory array.

16. The method of claim 15, wherein the first operation is a write operation, and further comprising:

de-activating, by the memory circuit, a read word line coupled to the first memory cell.

17. The method of claim 15, further comprising:

receiving, by the memory circuit, a third signal for a third memory operation, the third signal identifying a third memory cell in the same row as the first memory cell and the second memory cell; and generating, by the memory circuit, a third voltage for a third word line coupled to the third memory cell to select the third memory cell and de-select the first memory cell and the third memory cell.

18. The method of claim 15, further comprising:

receiving, by the memory circuit, a third signal for a third memory operation, the third signal identifying a third memory cell in the same row as the first memory cell and the second memory cell; and generating, by the memory circuit, the first voltage for the first word line coupled to the third memory cell to select the third memory cell and de-select the second memory cell, wherein the second memory cell is between the first memory cell and the third memory cell in the row.

19. The memory system of claim 1, wherein no two columns of the plurality of first columns and no two columns of the plurality of second columns are adjacent in the memory array.

20. The method of claim 15, wherein no two columns of the plurality of first columns and no two columns of the plurality of second columns are adjacent in the memory array.

* * * * *